(12) United States Patent
Takeuchi

(10) Patent No.: US 8,692,317 B2
(45) Date of Patent: Apr. 8, 2014

(54) SEMICONDUCTOR STORAGE DEVICE

(75) Inventor: Kiyoshi Takeuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 529 days.

(21) Appl. No.: 12/922,313

(22) PCT Filed: Apr. 14, 2009

(86) PCT No.: PCT/JP2009/057511
§ 371 (c)(1),
(2), (4) Date: Sep. 13, 2010

(87) PCT Pub. No.: WO2009/128450
PCT Pub. Date: Oct. 22, 2009

(65) Prior Publication Data
US 2011/0024828 A1 Feb. 3, 2011

(30) Foreign Application Priority Data

Apr. 16, 2008 (JP) ................................. 2008-107010

(51) Int. Cl.
*H01L 29/66* (2006.01)
(52) U.S. Cl.
USPC ........... 257/329; 257/331; 257/350; 257/365; 257/390; 257/401; 257/E21.661; 257/E27.098
(58) Field of Classification Search
CPC . H01L 27/11; H01L 27/0207; H01L 27/0924; H01L 27/1104; H01L 21/823821; H01L 21/823885
USPC .......... 257/E27.098, E21.661, 329, 331, 350, 257/365, 390, 401
See application file for complete search history.

(56) References Cited

U.S. PATENT DOCUMENTS

| | | | | |
|---|---|---|---|---|
| 2007/0007601 | A1* | 1/2007 | Hsu et al. | 257/368 |
| 2011/0018056 | A1* | 1/2011 | Takeuchi | 257/329 |

FOREIGN PATENT DOCUMENTS

| | | |
|---|---|---|
| JP | 6-69441 A | 3/1994 |
| JP | 7-99311 A | 4/1995 |
| JP | 8-88328 A | 4/1996 |
| JP | 8-241931 A | 9/1996 |
| JP | 9-232447 A | 9/1997 |
| JP | 10-79482 | 3/1998 |

(Continued)

OTHER PUBLICATIONS

International Search Report for PCT/JP2009/057511 mailed Jun. 23, 2009.

*Primary Examiner* — Kenneth Parker
*Assistant Examiner* — Jose R Diaz
(74) *Attorney, Agent, or Firm* — McGinn IP Law Group, PLLC

(57) ABSTRACT

An SRAM cell using a vertical MISFET is provided, wherein underside source/drain areas of a first access transistor, a first driving transistor and a first load transistor are connected together, and further connected to gates of a second driving transistor and a second load transistor. Underside source/drain areas of a second access transistor, the second driving transistor and the second load transistor are connected together, and further connected to gates of the first driving transistor and the first load transistor. A first arrangement of the first access transistor, the first driving transistor and the first load transistor, and a second arrangement of the second access transistor, the second driving transistor and the second load transistor are symmetric to each other.

36 Claims, 27 Drawing Sheets

(56) References Cited

FOREIGN PATENT DOCUMENTS

| | | |
|---|---|---|
| JP | 2002506575 A | 2/2002 |
| JP | 2002158350 A | 5/2002 |
| JP | 2003224211 A | 8/2003 |
| JP | 2004128448 A | 4/2004 |
| JP | 2004193588 A | 7/2004 |
| JP | 2008205168 A | 9/2008 |
| WO | 2009060934 A | 5/2009 |

* cited by examiner

SEMICONDUCTOR STORAGE DEVICE

TECHNICAL FIELD

The present invention relates to a semiconductor storage device, and in particular, to a semiconductor storage device including static random access memory (SRAM) cells that use vertical transistors.

BACKGROUND ART

In connection with MIS (Metal Insulator Semiconductor) field effect transistors (MISFETs), the reduction in size has lead to simultaneous improvement of integration and performance. Also for SRAMs that use MISFETs, miniaturized MISFETs have contributed to increasing capacity. In recent years, SRAMs have reached the level that a gate insulating film has a thickness of at most 2 nm and a gate length of at most 50 nm.

However, at this level, simple further miniaturization may disadvantageously lead to an increase in leakage current or in a variation in characteristics. Thus, further miniaturization is now difficult. Hence, the related technique that uses planar MISFETs has difficulty further increasing the integration degree of SRAMs.

In recent years, various techniques that utilize vertical MISFETs in order to improve the integration degree are disclosed in, for example, JP06-069441A, JP07-099311A, JP08-088328A, JP09-232447A, JP10-079482A, and JP2003-224211A.

The vertical MISFET is configured such that a channel current flows perpendicularly to a substrate surface (up-down direction), whereas in the planar MISFETs, a channel current flows horizontally with respect to the substrate surface. Compared to the use of the planar MISFET, the use of the vertical MISFET with the structure described above enables the reduction in the occupied area on the substrate.

DISCLOSURE OF THE INVENTION

In a semiconductor device with MISFETs, a wiring made of low-resistance metal such as aluminum or copper is normally located over the MISFET. This is because the low-resistance metal cannot withstand a high temperature condition during formation of the MISFET and because the low-resistance metal wiring thus needs to be formed after formation of the MISFET.

However, when an attempt is made to use a vertical MISFET in the semiconductor device in which the wiring is formed over the MISFET, the following problems may occur.

Normally, in the vertical MISFET, one of a source and a drain is located on the underside of a column portion made of a semiconductor and in which a channel is formed. The other of the source and the drain is located in the upper part of the column portion. That is, in the vertical MISFET, one of the source and the drain is necessarily located on the underside of the column portion. Thus, when the vertical MISFET is used, an issue is how to connect the underside source/drain and the wiring over the MISFET together.

In a structure in which the underside source/drain in the MISFET is buried under the column portion, a contact plug cannot be connected, from immediately above, to the underside source/drain. That is, the underside source/drain in the MISFET cannot be electrically connected to a conductive portion over the MISFET via the contact plug.

To solve this problem, for example, a structure shown in FIG. 1a and FIG. 1b can be used. FIG. 1b is a sectional view taken along line A-A in FIG. 1a.

The vertical MISFET shown in FIG. 1a and FIG. 1b includes an underside source/drain 112, a column portion 110 made of a semiconductor and provided on the underside source/drain 112, an upper-side source/drain 113 provided in the upper part of the column portion, and a gate electrode 111 covering the periphery of the column portion. A gate insulating film (not shown in the drawings) is interposed between the column portion 110 and the gate electrode 111. A channel is formed in the column portion between the underside source/drain 112 and the upper-side source/drain 113. The upper-side source/drain 113 is electrically connected to an upper-layer wiring 141.

In such a vertical MISFET, the underside source/drain 112 has an extension extending in the direction of the substrate plane from the bottom of the column portion 110. A contact plug 120 is connected to the extension. The underside source/drain 112 is electrically connected to the upper-layer wiring 142 via the contact plug 120.

However, this structure requires an extra area for connection of the contact plug 120. Thus, the advantage of the vertical MISFET, that is, the small occupied area, is impaired by the extra required area.

In a SRAM structure that prevents such a problem from occurring, a wiring connected to the underside source/drain 112 in the vertical MISFET shown in FIG. 2a and FIG. 2b is located under the column portion 110. Most of the related techniques that use vertical MISFETs adopt such a structure. This structure eliminates the need for the extra area required to connect the underside source/drain and the upper wiring, and is thus advantageous for improving the integration degree.

However, to allow a wiring to be formed on the underside of the MISFET by means of a general integrated circuit manufacturing method, the wiring material needs to be a conductive material which can withstand high temperatures, such as high-melting-point metal or silicon. Such a heat-resistant conductive material offers a higher electric resistance than normal wiring materials such as aluminum and copper, disadvantageously resulting in a high wiring resistance. As an alternative method for forming a wiring on the underside of the MISFET, a wiring structure with a separately formed wiring may be laminated to a structure with a MISFET already formed therein. However, this method disadvantageously offers a low processing accuracy, and has difficulty increasing the integration degree. Further, the method requires time-consuming manufacturing steps.

An object of the present invention is to provide a semiconductor storage device which is easy to manufacture and which offers high performance and a high integration degree.

According to exemplary aspects of the present invention, there are provided the following semiconductor storage devices:

(1) A semiconductor storage device including a plurality of static random access memory cells, wherein each of the cells includes a first access transistor, a second access transistor, a first driving transistor, a second driving transistor, a first load transistor and a second load transistor, each of the transistors includes a column portion made of a semiconductor projecting from a base portion surface, an underside conductive area provided in the base portion and serving as one of a source and a drain, an upper-side conductive area provided in an upper part of the column portion and serving as the other of the source and the drain, a gate electrode provided on a side surface of the column portion, and a gate insulating film interposed between the gate electrode and the column portion side surface; and in each of the cells, the underside conductive areas of the first access transistor, the first driving transistor and the first load transistor are electrically connected together, and further electrically connected to the gate electrodes of the second driving transistor and the second load transistor to form a first accumulation node, the underside conductive areas of the second access transistor, the second driving transistor and the second load transistor are electrically connected together, and further electrically connected to the gate electrodes of the first driving transistor and the first load transistor to form a second accumulation node, and a first arrangement of the column portion of the first access transistor, the column portion of the first driving transistor and the column portion of the first load transistor, and a second arrangement of the column portion of the second access transistor, the column portion of the second driving transistor and the column portion of the second load transistor are symmetric to each other.

(2) The semiconductor storage device according to item (1), wherein the base portion of the first access transistor and the base portion of one of the first driving transistor and the first load transistor are integrally coupled together to form a first coupled base portion;

the gate electrode of the first driving transistor and the gate electrode of the first load transistor are integrally coupled together to form a first coupled gate electrode including a first gate extension extending in the coupling direction;

the base portion of the second access transistor and the base portion of one of the second driving transistor and the second load transistor are integrally coupled together to form a second coupled base portion;

the gate electrode of the second driving transistor and the gate electrode of the second load transistor are integrally coupled together to form a second coupled gate electrode including a second gate extension extending in the coupling direction;

a first local interconnect is provided coupling the second gate extension, the base portion of the other of the first driving transistor and the first load transistor, and the first coupled base portion together; and a second local interconnect is provided coupling the first gate extension, the base portion of the other of the second driving transistor and the second load transistor, and the second coupled base portion together.

(3) The semiconductor storage device according to item (2), wherein the first local interconnect couples the second gate extension to a top side area of the first coupled base portion, the top side area being between the column portions of the two transistors sharing the first coupled base portion;

the second local interconnect couples the first gate extension to a top side area of the second coupled base portion, the top side area being between the column portions of the two transistors sharing the second coupled base portion; and the first local interconnect and the second local interconnect are symmetric to each other. In this semiconductor storage device, for symmetry, the first local interconnect preferably couples the second gate extension to the intermediate point on the first coupled base portion between column portions of the two transistors sharing the first coupled base portion, and the second local interconnect preferably couples the first gate extension to the intermediate point on the second coupled base portion between column portions of the two transistors sharing the second coupled base portion.

(4) The semiconductor storage device according to item (1), wherein the base portion of the first access transistor, the base portion of the first driving transistor and the base portion of the first load transistor are integrally formed to provide a first integrated base portion;

the gate electrode of the first driving transistor and the gate electrode of the first load transistor are integrally coupled together to provide a first coupled gate electrode;

the base portion of the second access transistor, the base portion of the second driving transistor and the base portion of the second load transistor are integrally formed to provide a second integrated base portion;

the gate electrode of the second driving transistor and the gate electrode of the second load transistor are integrally coupled together to provide a second coupled gate electrode;

a first local interconnect is provided coupling the second coupled gate electrode and the first integrated base portion together to form a first accumulation node; and a second local interconnect is provided coupling the first coupled gate electrode and the second integrated base portion together to form a second accumulation node.

(5) The semiconductor storage device according to item (4), wherein the first coupled gate electrode includes a first gate extension extending in the coupling direction of the first coupled gate electrode, the second coupled gate electrode includes a second gate extension extending in the coupling direction of the second coupled gate electrode, the first local interconnect couples the second gate extension and the first integrated base portion together, and the second local interconnect couples the first gate extension and the second integrated base portion together.

(6) The semiconductor storage device according to item (5), wherein the first integrated base portion includes a first conductivity type semiconductor area and a second conductivity type semiconductor area joined to the first conductivity type semiconductor area, the first conductivity type semiconductor area includes the column portion of the first access transistor and the column portion of one of the first driving transistor and the first load transistor, and the second conductivity type semiconductor area includes the column portion of the other of the first driving transistor and the first load transistor;

the second integrated base portion includes a first conductivity type semiconductor area and a second conductivity type semiconductor area joined to the first conductivity type semiconductor area, the first conductivity type semiconductor area includes the column portion of the second access transistor and the column portion of one of the second driving transistor and the second load transistor, and the second conductivity type semiconductor area includes the column portion of the other of the second driving transistor and the second load transistor;

the first local interconnect is provided on the first integrated base portion such that the first local interconnect strides over a boundary between the first conductivity type semiconductor area and the second conductivity type semiconductor area; and the second local interconnect is provided on the second integrated base portion such that the second local interconnect strides over a boundary between the first conductivity type semiconductor area and the second conductivity type semiconductor area.

(7) The semiconductor storage device according to item (4), wherein the first integrated base portion includes a first base extension extending from the column portion side of the first access transistor toward the second coupled gate electrode;

the first local interconnect couples the first base extension to a top side area of the second coupled gate electrode between the column portions of two transistors sharing the second coupled gate electrode;

the second integrated base portion includes a second base extension extending from the column portion side of the second access transistor toward the first coupled gate electrode; and the second local interconnect couples the second base extension to a top side area of the first coupled gate electrode between the column portions of two transistors sharing the first coupled gate electrode. In the semiconductor storage device, for symmetry, the first local interconnect preferably couples the first base extension to the intermediate point on the second coupled gate electrode between the column portions of the two transistors sharing the second coupled gate electrode, and the second local interconnect preferably couples the second base extension to the intermediate point on the first coupled gate electrode between the column portions of the two transistors sharing the first coupled gate electrode.

(8) The semiconductor storage device according to any one of items (1) to (7), wherein in each of the first and second arrangements, the three column portions are arranged in an L shape.

(9) The semiconductor storage device according to item (4), wherein the first local interconnect couples a top side area of the second coupled gate electrode between the column portions of the two transistors sharing the second coupled gate electrode to a top side area of the first integrated base portion between the column portions of the two transistors sharing the first integrated base portion; and the second local interconnect couples a top side area of the first coupled gate electrode between the column portions of the two transistors sharing the first coupled gate electrode to a top side area of the second integrated base portion between the column portions of the two transistors sharing the second integrated base portion. In the semiconductor storage device, for symmetry, the first local interconnect preferably couples the intermediate point on the second coupled gate electrode between the column portions of the two transistors sharing the second coupled gate electrode to the intermediate point on the first integrated base portion between the column portions of the two transistors sharing the first integrated base portion, and the second local interconnect preferably couples the intermediate point on the first coupled gate electrode between the column portions of the two transistors sharing the first coupled electrode to the intermediate point on the second integrated base portion between the column portions of the two transistors sharing the second integrated base portion.

(10) The semiconductor storage device according to item (4), wherein the column portions of the first driving transistor and the first load transistor are arranged in parallel with the column portions of the second driving transistor and the second load transistor;

the first coupled gate electrode includes a first gate extension extending in the coupling direction thereof;

the second coupled gate electrode includes a second gate extension extending in a direction opposite to a direction in which the first gate extension extends;

the second integrated base portion includes a base extension extending along the direction in which the first gate extension extends;

the second local interconnect couples the base extension and the first gate extension together; and the first local interconnect couples the second gate extension to a top side area of the first integrated base portion between the column portion of the first access transistor and the column portion of one of the first driving transistor and the first load transistor.

(11) The semiconductor storage device according to item (4), wherein the column portions of the first driving transistor and the first load transistor are arranged in parallel with the column portions of the second driving transistor and the second load transistor;

the first coupled gate electrode includes a first gate extension extending toward the second integrated base portion;

the second coupled gate electrode includes a second gate extension extending toward the first integrated base portion;

the first integrated base portion includes a first base extension extending toward the second coupled gate electrode;

the second integrated base portion includes a second base extension extending toward the first coupled gate electrode;

the first local interconnect couples the first base extension and the second gate extension together; and the second local interconnect couples the second base extension and the first gate extension.

(12) The semiconductor storage device according to any one of items (9) to (11), wherein in each of the first and second arrangements, the three column portions are linearly arranged.

(13) The semiconductor storage device according to any one of items (4) to (12), wherein the first integrated base portion includes a first conductivity type semiconductor area and a second conductivity type semiconductor area joined to the first conductivity type semiconductor area, the first conductivity type semiconductor area includes the column portion of the first access transistor and the column portion of one of the first driving transistor and the first load transistor, the second conductivity type semiconductor area includes the column portion of the other of the first driving transistor and the first load transistor, and a metal-containing conductive layer is provided on an area including a boundary between the first conductivity type semiconductor area and the second conductivity type semiconductor area; and the second integrated base portion includes a first conductivity type semiconductor area and a second conductivity type semiconductor area joined to the first conductivity type semiconductor area, the first conductivity type semiconductor area includes the column portion of the second access transistor and the column portion of one of the second driving transistor and the second load transistor, the second conductivity type semiconductor area includes the column portion of the other of the second driving transistor and the second load transistor and a metal-containing conductive layer is provided on an area including a boundary between the first conductivity type semiconductor area and the second conductivity type semiconductor area.

(14) The semiconductor storage device according to any one of items (4) to (12), wherein each of the first and second integrated base portions includes a metal-containing conductive layer.

(15) The semiconductor storage device according to any one of items (1) to (14), wherein in each of the first and second arrangements, the three column portions are arranged at equal intervals.

(16) The semiconductor storage device according to any one of items (1) to (15), wherein the two column portions in the first arrangement and the two column portions in the second arrangement are positioned at respective vertices of a rectangle, and the two other column portions are arranged on the respective long sides of the rectangle.

(17) The semiconductor storage device according to item (16), wherein the six column portions are arranged at equal intervals along the four sides of the rectangle.

(18) The semiconductor storage device according to any one of items (1) to (17), wherein the cells are arranged in a matrix along a first direction and a second direction perpendicular to the first direction; and the column portions are arranged over a plurality of the cells at equal intervals along one or both of the first direction and the second direction.

(19) The semiconductor storage device according to items (4) or (9), wherein the cells are arranged in a matrix along a first direction and a second direction perpendicular to the first direction, and the cells are arranged mirror-symmetrically along the first direction with respect to a cell boundary in the second direction; and in each of the cells,
in each of the first and second arrangements, the three column portions are arranged linearly at equal intervals,
the two column portions in the first arrangement and the two column portions in the second arrangement are positioned at respective vertices of a rectangle, and the two other column portions are arranged on the respective long sides of the rectangle, and
the column portions of the first and second access transistors are arranged at respective vertices of one of diagonal lines of the rectangle.

(20) The semiconductor storage device according to item (19), wherein the six column portions are arranged at equal intervals a long the four sides of the rectangle.

(21) The semiconductor storage device according to item (19) or (20), wherein the column portions are arranged over a plurality of the cells at equal intervals along one or both of the first direction and the second direction.

(22) The semiconductor storage device according to any one of items (19) to (21), wherein the first and second local interconnects each include a buried interconnect having a rectangular planar shape, and are arranged at equal intervals over a plurality of the cells along a second direction in a longitudinal direction of the rectangle.

(23) The semiconductor storage device according to item (1), (10), or (11), wherein the cells are arranged in a matrix along a first direction and a second direction perpendicular to the first direction, and the gate electrodes of the first and second access transistors are consecutively and integrally provided along one of the first and second directions over a plurality of the cells.

(24) The semiconductor storage device according to item (23), wherein in each of the cells, in each of the first and second arrangements, the three column portions are arranged in an L shape,
the column portions of the first and second driving transistors and the first and second load transistors are positioned at respective vertices of a rectangle, and
the column portions of the first and second access transistors are arranged on respective long sides of the rectangle.

(25) The semiconductor storage device according to item (23), wherein in each of the cells, in each of the first and second arrangements, the three column portions are arranged linearly,
the two column portions in the first arrangement and the two column portions in the second arrangement are positioned at respective vertices of a rectangle, and the two other column portions are arranged on the respective long sides of the rectangle, and the column portions of the first and second access transistors are arranged at respective vertices of one of short sides of the rectangle.

(26) The semiconductor storage device according to any one of items (1) to (25), wherein a first bit line and a second bit line, a ground line and a power line are provided over a plurality of the cells such that the lines stride over the cells;

the upper-side conductive area of the first access transistor is electrically connected to the first bit line;
the upper-side conductive area of the second access transistor is electrically connected to the second bit line;
the upper-side conductive areas of the first and second driving transistors are electrically connected to the ground line; and
the upper-side conductive areas of the first and second load transistors are electrically connected to the power line.

The present invention can provide a semiconductor storage device which is easy to manufacture and which offers high performance and a high integration degree.

BRIEF DESCRIPTION OF THE DRAWINGS

FIG. 5b is a sectional view taken along line A-A in FIG. 5a;

FIG. 5c is a sectional view taken along line B-B in FIG. 5a;

FIG. 5d is a sectional view taken along line C-C in FIG. 5a;

FIG. 8b is a sectional view taken along line A-A in FIG. 8a;

FIG. 8c is a sectional view taken along line B-B in FIG. 8a;

FIG. 8d is a sectional view taken along line C-C in FIG. 8a;

FIG. 9b is a sectional view taken along line A-A in FIG. 9a;

FIG. 9c is a sectional view taken along line B-B in FIG. 9a;

FIG. 9d is a sectional view taken along line C-C in FIG. 9a;

FIG. 10b is a sectional view taken along line A-A in FIG. 10a;

FIG. 10c is a sectional view taken along line B-B in FIG. 10a;

FIG. 10d is a sectional view taken along line C-C in FIG. 10a;

FIG. 11b is a sectional view taken along line A-A in FIG. 11a;

FIG. 11c is a sectional view taken along line B-B in FIG. 11a;

FIG. 11d is a sectional view taken along line C-C in FIG. 11a;

FIG. 14b is a sectional view showing the structure after a step following a step of forming the structure shown in FIG. 14a;

BEST MODE FOR CARRYING OUT THE INVENTION

An exemplary embodiment will be described in detail with reference to the drawings.

Figure 3:
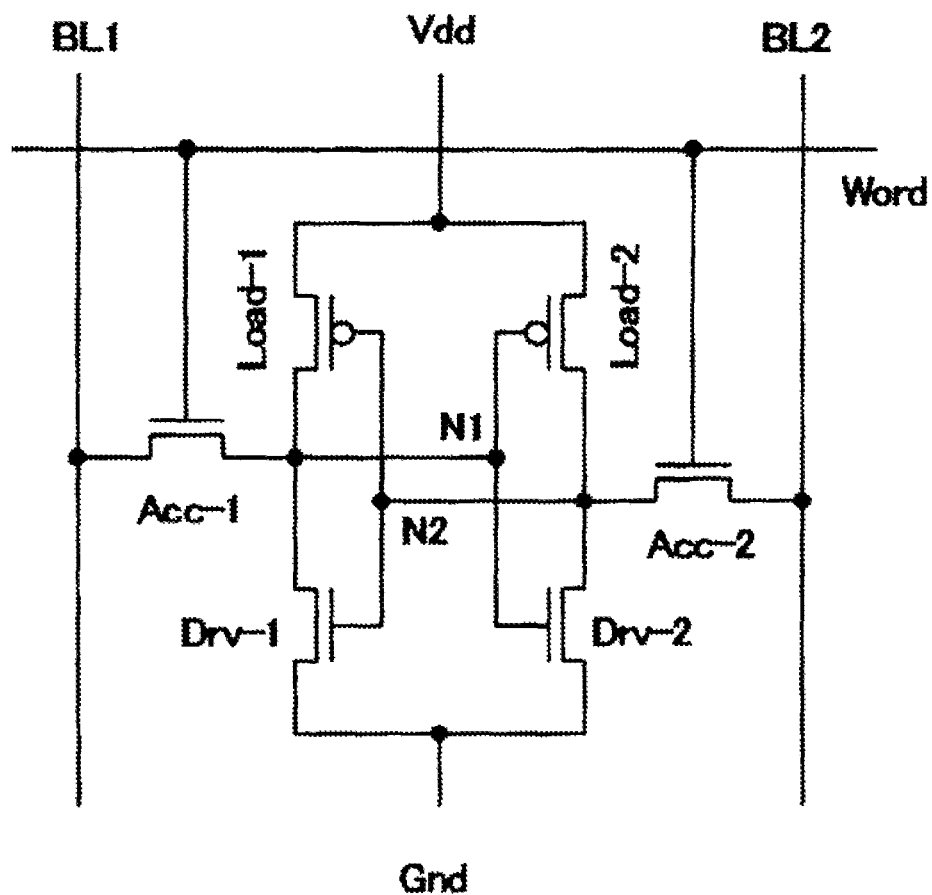
FIG. 3 is a circuit diagram of a unit cell of a SRAM in accordance with an exemplary embodiment of the present invention.

As shown in FIG. 3, a cell in a SRAM according to the exemplary embodiment includes a first access transistor Acc-1 and a second access transistor Acc-2, a first driving transistor Drv-1 and a second driving transistor Drv-2, and a first load transistor Load-1 and a second load transistor Load-2. The first driving transistor and the first load transistor form a first inverter. The second driving transistor and the second load transistor form a second inverter. An output node of the first inverter is input to the second inverter. An output node of the second inverter is input to the first inverter.

When one of a first accumulation node N1 and a second accumulation node N2 is at a ground potential (Gnd), the other is at a power supply potential (Vdd). When one of the first and second accumulation nodes N1 and N2 is at the power supply potential (Vdd), the other is at the ground potential (Gnd). Either the sources or drains of the first access transistor, the first driving transistor, and the first load transistor are electrically connected together to form the first accumulation node N1. Either the sources or drains of the second access transistor, the second driving transistor, and the second load transistor are electrically connected together to form the second accumulation node N2. The first accumulation node N1 is connected to gate electrodes of the second driving transistor and the second load transistor. The second accumulation node is connected to gate electrodes of the first driving transistor and the first load transistor. The other of the source and drain of the first access transistor is connected to a first bit line BL1. The other of the source and drain of the second access transistor is connected to a second bit line BL2. That is, the accumulation node N1 is connected to the first bit line BL1 via the first access transistor. The accumulation node N2 is connected to the second bit line BL2 via the second access transistor. Gates of the first and second access transistors are connected to a common word line Word. The other of the source and drain of each of the first and second load transistors is connected to a power line Vdd. The other of the source and drain of each of the first and second driving transistors is connected to a ground line Gnd.

Both the power line and the ground line supply predetermined constant voltages to SRAM cells. In general, the line through which a high voltage is supplied is called the power line, and the line through which a low voltage is supplied is called the ground line.

The first and second driving transistors may be N channel MISFETs. The first and second load transistors may be P channel MISFETs. The first and second access transistors may be N channel MISFETs. The first and second access transistors may be P channel MISFETs.

The six transistors in the SRAM cell are all vertical MISFETs. Each vertical MISFET includes a column portion made of including a semiconductor projecting perpendicularly from the surface of a base, an underside conductive area provided on the base and serving as one of a source and a drain, an upper-side conductive area provided in the upper part of the column portion and serving as the other of the source and drain, a gate electrode provided on the side surface of the column portion, and a gate insulating film interposed between the gate electrode and the side surface of the column portion. The gate electrode is preferably provided so as to surround the periphery of the column portion with the intervention of the gate insulating film.

In such a SRAM cell, the underside conductive areas of the first access transistor, the first driving transistor, and the first load transistor are electrically connected together and further electrically connected to the gate electrodes of the second load transistor and the second driving transistor to form the first accumulation node. The underside conductive areas of the second access transistor, the second driving transistor, and the second load transistor are electrically connected together and further electrically connected to the gate electrodes of the first load transistor and the first driving transistor to form the second accumulation node. That is, in each of the six vertical MISFETs in the cell, the underside conductive area (underside source/drain) forms the first or second accumulation node. The upper-side conductive area (upper-side source/drain) is connected to a wiring (bit line, power line, or ground line) striding across cells over the MISFET.

In such a structure, all the wirings striding across the cells and each connected to one of the source and drain of the vertical MISFETs in each cell can be formed over the MISFETs. That is, the wirings can be formed of wiring material for planar MISFETs with a low resistance. As a result, a high-performance SRAM can be implemented. On the other hand, the connection between MISFETs in the cell involves a short connection distance because of the proximity between the MISFETs. Thus, even if a conventional wiring material having high heat-resistance is used for the connection, the element performance is prevented from being degraded as a result of the wiring resistance of the material.

Furthermore, the above-described structure eliminates the need for a contact plug connected to the underside source/drain of the vertical MISFET. This allows a SRAM with a high integration degree to be implemented.

Furthermore, in a process of manufacturing the above-described structure, a step of forming a contact plug connected to the underside source/drain of the vertical MISFET can be avoided. Additionally, the above-described lamination step can be avoided. The corresponding components (column portions and the like) of all of the six vertical MISFETs in the cell can be formed within one step. This allows the process to be simplified compared to the case where MISFETs are stacked. Thus, SRAMs with the above-described structure can be easily manufactured.

In the above-described exemplary embodiment, moreover, in the SRAM cell, a first arrangement for the column portions of the first access transistor, the first driving transistor, and the first load transistor has a symmetric relationship with a second arrangement for the column portions of the second access transistor, the second driving transistor, and the second load transistor.

Such a layout in the cell enables an increase in density and in integration degree. Furthermore, the high symmetry allows processing accuracy to be improved during manufacturing and enables a smaller size and a higher integration degree to be achieved. Additionally, in the SRAM, symmetric characteristics serve to maximize the performance. The above-described layout in the cell enables the symmetry of the characteristics to be easily achieved, thus allowing the performance to be improved.

In view of the symmetry and the structure simplification, in each of the first and second arrangements, the three column portions are preferably arranged linearly or in an L shape. Furthermore, in each of the first and second arrangements, the three column portions are preferably arranged at equal intervals. Additionally, the two column portions in the first arrangement and the two column positions in the second arrangement are preferably positioned at the respective vertices of a rectangle, with the other column portions arranged on the respective long sides of the rectangle (this arrangement is hereinafter referred to as a "rectangular arrangement").

Figure 4:
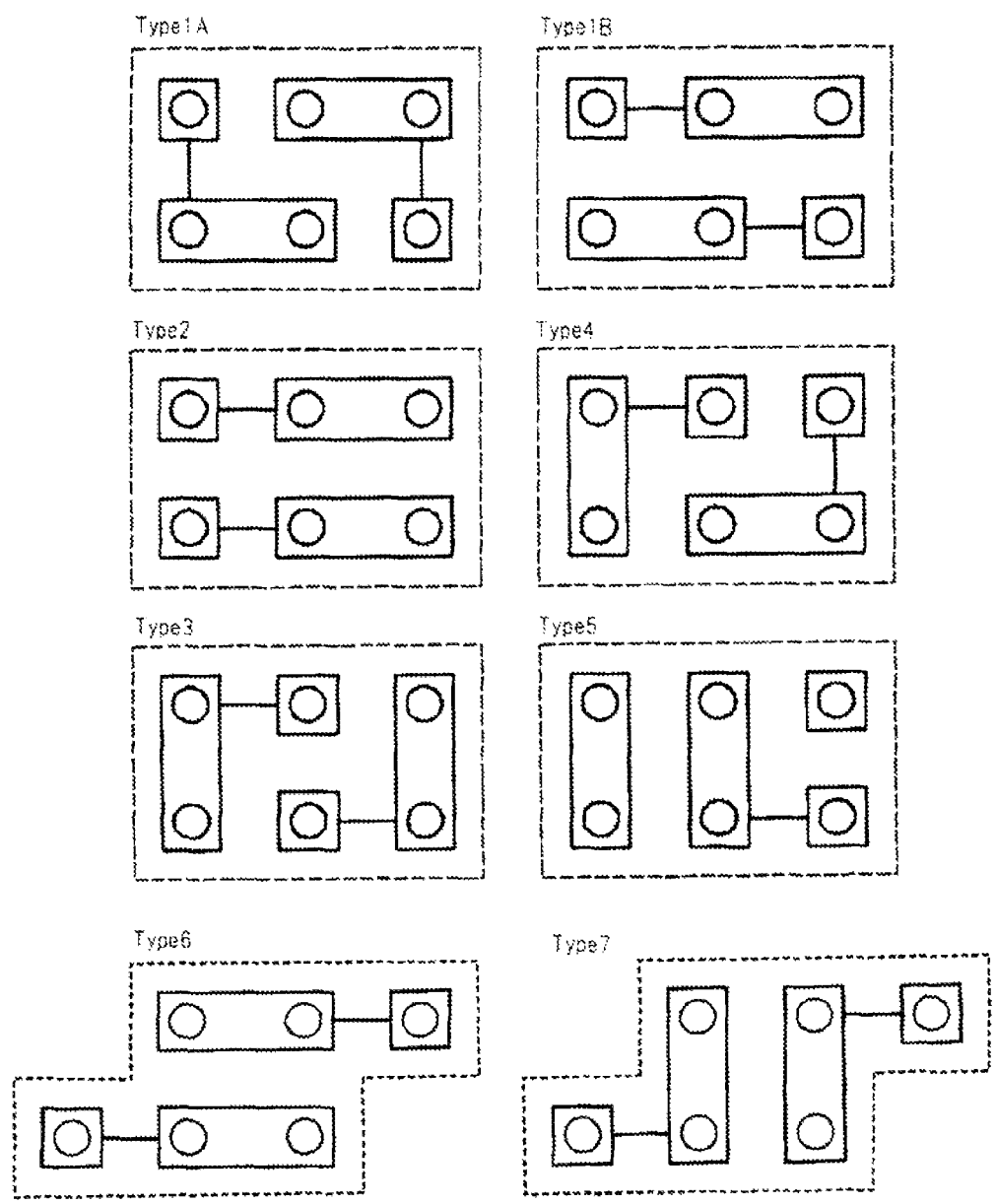
FIG. 4 is a schematic diagram illustrating examples of intra-cell arrangement of a SRAM in accordance with an exemplary embodiment of the present invention.

FIG. 4 schematically shows examples of layout of a SRAM cell according to the exemplary embodiment, with comparative examples for comparison.

In the figure, circles indicate the positions of the MISFETs (the positions of the column portions). Dashed rectangles each enclosing six circles indicate the areas of unit cells. Solid rectangles each enclosing two circles indicate that the two MISFETs correspond to the two circles in the rectangle are the driving transistor and load transistor forming one inverter (inverter unit). Squares each enclosing one circle indicate that the MISFET corresponding to the circle in the square is the access transistor. A solid line (coupling line) connecting the rectangle and the square together indicates that the two MISFETs corresponding to the two circles in the rectangle and the MISFET corresponding to the circle in the square belong to the same accumulation node (first accumulation node N1 or second accumulation node N2).

In the rectangular areas, the dense arrangement of the inverter unit and the access transistor is classified into five types Type 1 (Type 1A and Type 1B) and Types 2 to 5, with equivalent arrangements based on symmetry excluded.

With the connection line taken into account, the arrangement of Type 1 is classified into two types Type 1A and Type 1B. In the arrangement of Type 2, connection lines may cross each other but the corresponding arrangement lacks practicality. Thus, as shown in the figure, the connection lines preferably avoid crossing each other.

Types 4 and 5 correspond to asymmetric arrangements. In Type 5, one access transistor is isolated, preventing a SRAM with desired effects from being obtained.

In terms of density, practicality, and the like, four arrangements including Types 1A, 1B, 2, and 3 are preferable.

Type 1A indicates a rectangular arrangement in which the first and second arrangements are in an L shape. The column portions of the first and second access transistors are positioned at the respective vertices of one of the diagonal lines of the rectangle. The first and second arrangements are in a point-symmetric relationship.

Type 1B indicates a rectangular arrangement in which the first and second arrangements are linear. The column portions of the first and second access transistors are positioned at the respective vertices of one of the diagonal lines of the rectangle. The first and second arrangements are in a point-symmetric relationship. Types 1A and 1B are the same in the arrangement of the two access transistors and the two inverter units (load transistor and driving transistor) but are different in the manner of the connection between the access transistor and the inverter unit.

Type 2 indicates a rectangular arrangement in which the first and second arrangements are linear. The column portions of the first and second access transistors are positioned at the respective opposite ends (both vertices) of one of the short sides of the rectangle. The first and second arrangements are line symmetric (or surface symmetric).

Type 3 indicates a rectangular arrangement in which the first and second arrangements are in an L shape. The column portions of the first and second access transistors are positioned on the respective long sides of the rectangle. The first and second arrangements are in a point-symmetric relationship.

The above-described types relate to rectangular arrangements. However, a parallelogram arrangement may be used, for example, as in Types 6 and 7. That is, the two column portions in the first arrangement and the two column portions in the second arrangement are positioned at the respective vertices of a parallelogram, with the other column portions arranged on the respective long sides of the parallelogram.

The present invention will be described below with reference to further exemplary embodiments. A first exemplary embodiment and a second exemplary embodiment are included in Type 1A. A third exemplary embodiment is included in Type 1B. A fourth exemplary embodiment is included in Type 3. A fifth exemplary embodiment and a sixth exemplary embodiment are included in Type 2. The first and second access transistors will be described as N channel MISFETs unless otherwise specified.

First Exemplary Embodiment

An SRAM according to the first exemplary embodiment of the present invention will be described with reference to FIGS. 5*a* to 9*d*.

A SRAM in the present example is provided on a bulk semiconductor substrate. The semiconductor substrate is typically an Si substrate but may be a substrate formed of SiGe, Ge, or any other semiconductor.

Figure 5A:
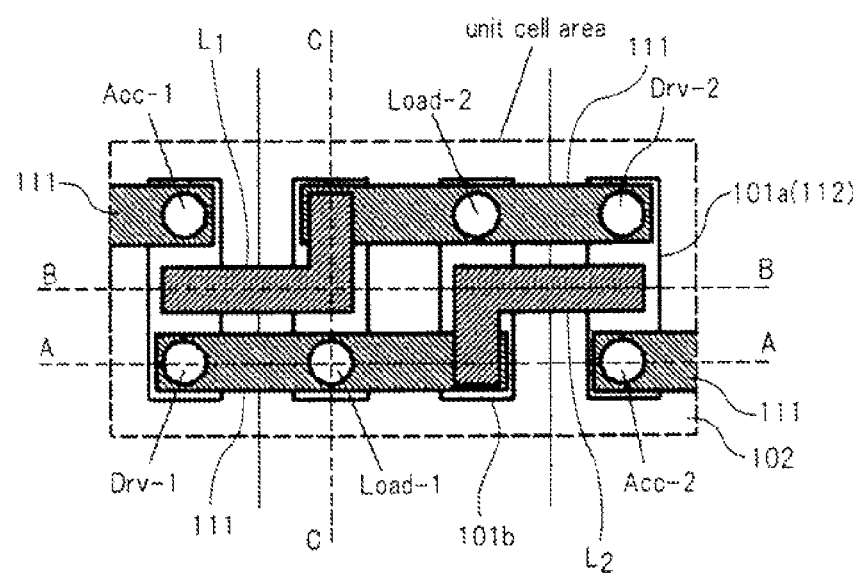
FIG. 5a is a plan view of a unit cell for explaining a SRAM in accordance with a first exemplary embodiment of the present invention.
Figure 5B:
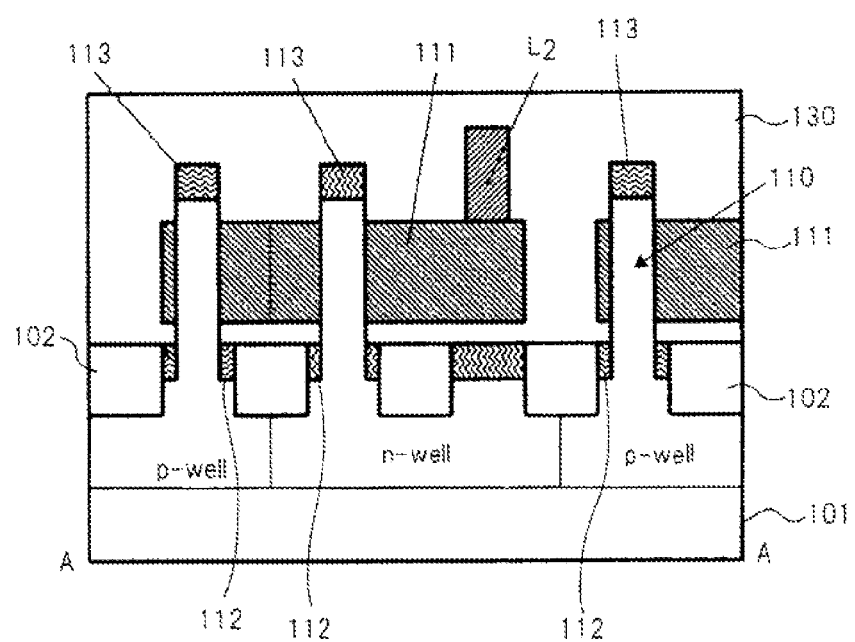
Figure 5C:
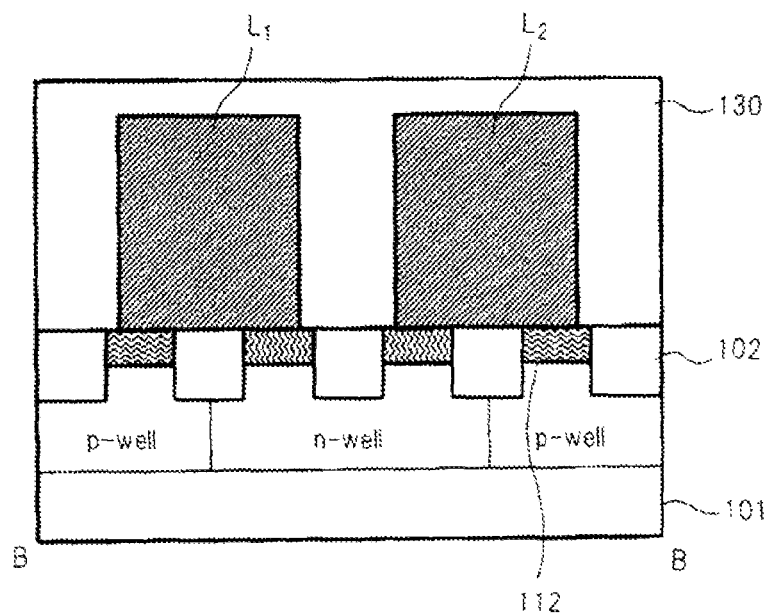
Figure 5D:
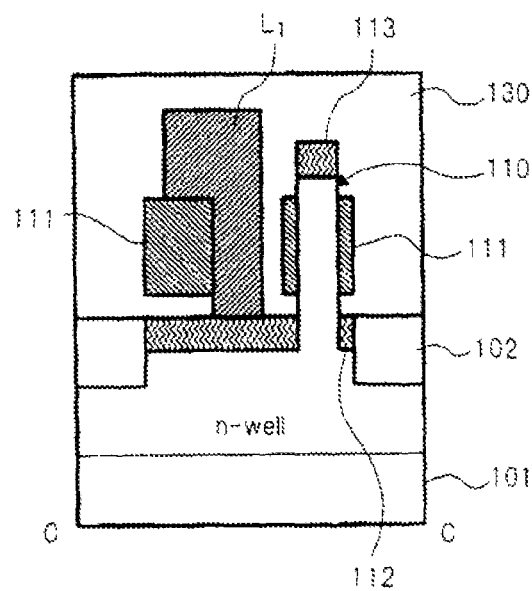
Figure 5E:
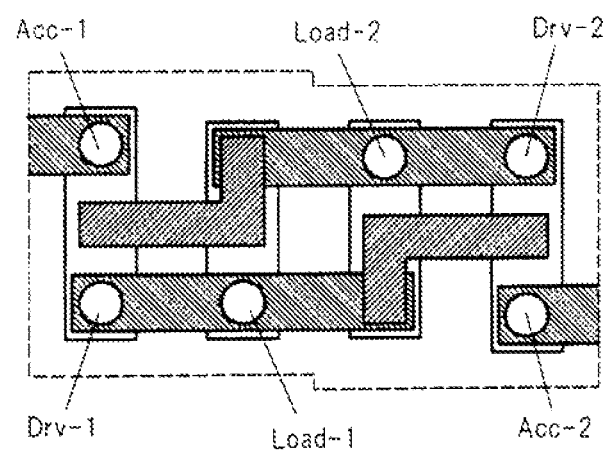
FIG. 5e is a plan view of a unit cell for explaining a variation of the SRAM in accordance with the first exemplary embodiment of the present invention.

FIG. 5*a* is a plan view showing a unit cell in a SRAM according to the exemplary embodiment. FIG. 5*b* is a sectional view taken along line A-A in FIG. 5*a*. FIG. 5*c* is a sectional view taken along line B-B in FIG. 5*a*. FIG. 5*d* is a sectional view taken along line C-C in FIG. 5*a*. FIG. 5*e* is a plan view showing a unit cell according to a variation of the present exemplary embodiment. For visibility reasons, in FIGS. 5*a* and 5*e* showing plan views, hatching indicating the source/drain and an interlayer insulating film 130, shown in FIGS. 5*b* to 5*d*, are omitted. Furthermore, in FIG. 5*a*, a dotted rectangle indicates the area of a unit cell. A solid line crossing the rectangle in the vertical direction indicates the boundary between a p-well and an n-well. Reference numerals L1 and L2 denote local interconnects including buried wirings.

Each of six transistors forming the cell includes a cylindrical semiconductor portion (column portion) 110 projecting upward from a semiconductor substrate 101. An upper-side source/drain 113 is provided at the upper end of the column portion. A underside source/drain 112 is provided close to the root of the column portion. A channel is formed in a part of the column portion which is sandwiched between the paired source/drain areas 112 and 113. A gate electrode 111 is provided around the periphery of the channel formation area with the intervention of a gate insulating film (not shown in the drawings). The underside source/drain 112 has an area in the direction of the substrate plane (the in-plane direction parallel to the substrate surface) defined by an element-isolating insulator 102 and an underside boundary defined by the depth of the underside source/drain 112 itself. In the present example that uses the bulk substrate, an active area surrounded by the element-isolating insulator 102 forms a base portion of each transistor. In the present example, base potions of access transistors Acc-1 and Acc-2 are integrally coupled to base portions of driving transistors Drv-1 and Drv-2, respectively. The resultant area corresponds to an active area 101*a*. A base portion of each of load transistors Load-1 and Load-2 corresponds to an active area 101*b*. The column portion 110 of each transistor is composed of a semiconductor section projecting upward from the corresponding surface position of the base portion.

Figure 6A:
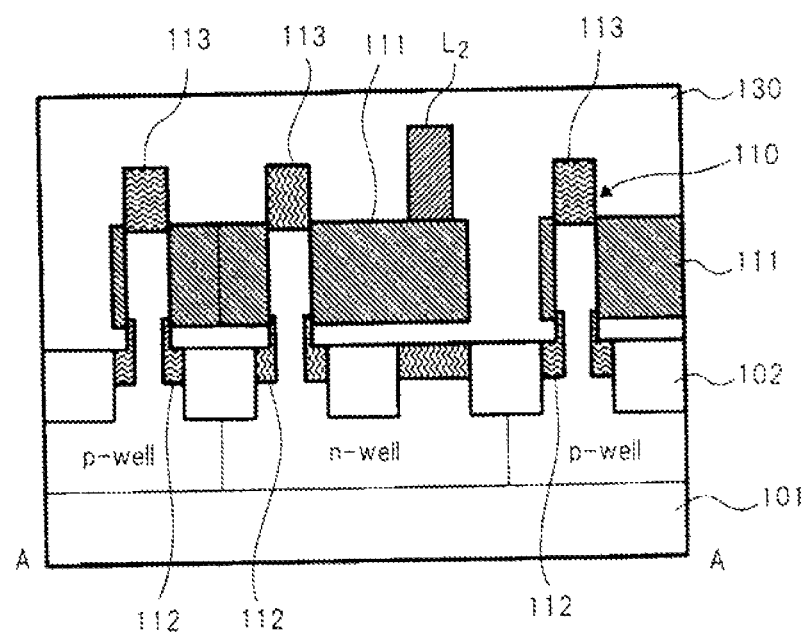
FIG. 6a is a sectional view showing a variation of a source/drain in the structure example shown in FIG. 5b.
Figure 6B:
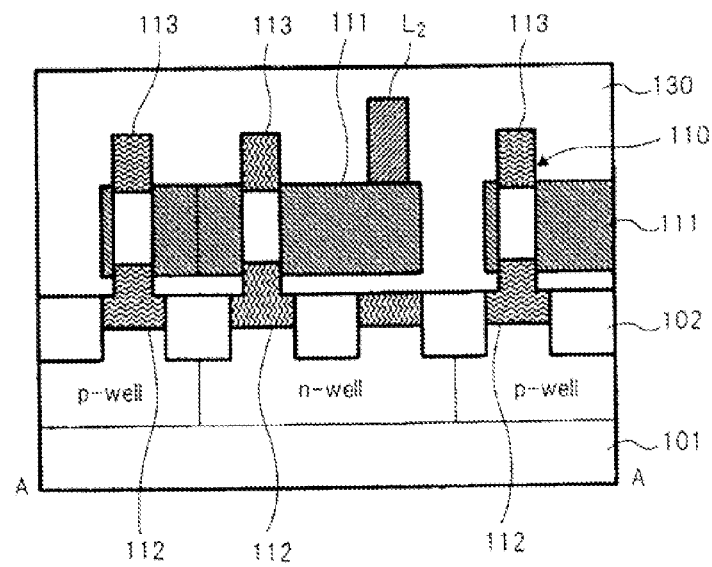
FIG. 6b is a sectional view showing another variation of a source/drain in the structure example shown in FIG. 5b.

Normally, the source/drain of an N channel MISFET is an N-type semiconductor area of a high concentration. The source/drain of a P channel MISFET is a P-type semiconductor area of a high concentration. In the example shown in FIG. 5*b*, the source/drain and the gate are separated from each other. However, as shown in FIGS. 6*a* and 6*b*, the source/drain and the gate may overlap with the intervention of the gate insulating film. These structures can be formed by appropriately diffusing impurities for the source/drain toward the gate during a manufacturing process.

In the example shown in FIG. 5*b*, the underside source/drain 112 is formed in an area in the base portion in which no column portion is present above. In the example shown in FIG. 6*a*, the underside source/drain is formed under the column portion and extends into the column portion itself. However, an area without forming the underside source/drain remains so that the channel formation area in the column portion is electrically continuous with the semiconductor substrate main body under the column portion. According to such a structure, the channel formation area in the column portion of each transistor is electrically connected to the semiconductor substrate. This is effective for preventing what is called a substrate floating effect that makes the potential of the channel formation area unstable. As shown in FIG. 5*a*, each of the base portions (active areas) 101*a* and 101*b* and the underside source/drain 112 formed in the base portions have corresponding contours in the planar area.

The underside source/drain may be formed all over the bottom surfaces of the column portions as shown in FIG. 6*b*. If the channel formation area in the column portion is completely separated from the semiconductor base by the underside source/drain, the transistor is desirably designed such that a perfect depletion operation is performed in which the channel formation area is completely depleted during inversion.

For the gate electrode, the same metal material is preferably used for the N channel MISFET and for the P channel MISFET because of the easiness with which the MISFETs are manufactured. Normally, metal is selected which has a work function in the vicinity of the center of a forbidden band in a semiconductor. However, to allow the work function for the gate to be fine-tuned, different materials may be used for the N channel MISFET and for the P channel MISFET.

A P well and an N well are formed in the semiconductor substrate in the present example as is the case with the related planar MISFET. Normally, the P well is provided with the ground potential (Gnd), and the N well is provided with the power supply potential (Vdd). Thus, a reverse bias is applied to between the underside source/drain and the well and between the N well and the P well, ensuring that the underside source/drain and the well are insulated from each other and that the N well and the P well are insulated from each other.

In the present example, the base portion of the first access transistor Acc-1 (N channel MISFET) is formed integrally with the base portion of the first driving transistor Drv-1 (N channel MISFET). That is, the first access transistor and the first driving transistor are formed on the same active area. Thus, the underside source/drain of the first access transistor and the underside source/drain of the first driving transistor can be integrated together and thus short-circuited without the need for wiring, thus allowing a part of the first accumulation node N1 to be formed. On the other hand, the base portion of the first load transistor Load-1 (P channel MISFET) is formed separately from the base portion of the first access transistor Acc-1 and the base portion of the first driving transistor Drv-1. Similarly, the base portion of the second access transistor Acc-2 is formed integrally with the base portion of the second driving transistor Drv-2. That is, the second access transistor and the second driving transistor are formed on the same active area. Thus, the underside source/drain of the second access transistor and the underside source/drain of the second driving transistor can be integrated together and thus short-circuited without the need for wiring, thus allowing a part of the second accumulation node N2 to be formed. On the other hand, the base portion of the second load transistor Load-2 is formed separately from the second access transistor Acc-2 and the second driving transistor Drv-2.

The base portion of the N channel MISFET and the base portion of the P channel MISFET are separated from each other in order to prevent possible short-circuiting with the power supply or the ground. Given that no element-isolating insulator is present between the N-type underside source-drain and the P-type underside source-drain, the N-type underside source-drain short-circuits with the power supply via the N well or the P-type underside source-drain short-circuits with the ground via the P well. Thus, malfunctioning may occur.

As shown in FIG. 5a and FIG. 5b, the gate electrode of the first driving transistor and the gate electrode of the first load transistor are formed integrally with each other. The gate electrodes include an extension extending toward the second access transistor (rightward in the figures) in the arrangement direction of the column portions of the first driving transistor and the first load transistor. The gate electrode of the second driving transistor and the gate electrode of the second load transistor are formed integrally with each other. The gate electrodes include an extension extending toward the first access transistor (leftward in the figures) in the arrangement direction of the column portions of the second driving transistor and the second load transistor.

The first local interconnect L1 is used to short-circuit the integrally formed underside source/drain of the first access transistor and the first driving transistor, the underside source/drain of the first load transistor, and the integrally formed gate electrode of the second driving transistor and the second load transistor. Thus, the first accumulation node N1 is formed. One end of the local interconnect N1 is connected to the extension of the gate electrode. The other end of the local interconnect N1 is connected onto the underside source/drain between the column portion of the first access transistor and the column portion of the first driving transistor. The second local interconnect L2 is used to short-circuit the integrally formed underside source/drain of the second access transistor and the second driving transistor, the underside source/drain of the second load transistor, and the integrally formed gate electrode of the first driving transistor and the first load transistor. Thus, the second accumulation node N2 is formed. One end of the local interconnect L2 is connected to the extension of the gate electrode. The other end of the local interconnect L2 is connected onto the underside source/drain between the column portion of the second access transistor and the column portion of the second driving transistor. For symmetry, each of the local interconnects L1 and L2 preferably couples the extension and the intermediate point between the column portions together.

Although not shown in the drawings, the upper-side source/drain areas of the first and second driving transistors are connected to the ground line Gnd, and the upper-side source/drain areas of the first and second load transistors are connected to the power line Vdd. Furthermore, the upper-side source/drain of the first access transistor is connected to the first bit line BL1, and the upper-side source/drain of the second access transistor is connected to the second bit line BL2. The gate electrodes of the first and second access transistors are connected to the word line.

Figure 1A:
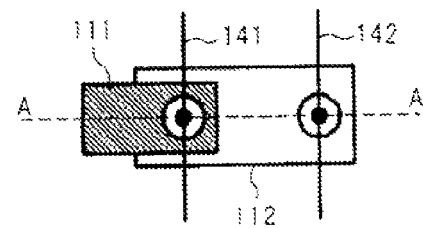
FIG. 1a is a plan view for explaining the structure of a related example of a vertical MISFET.
Figure 1B:
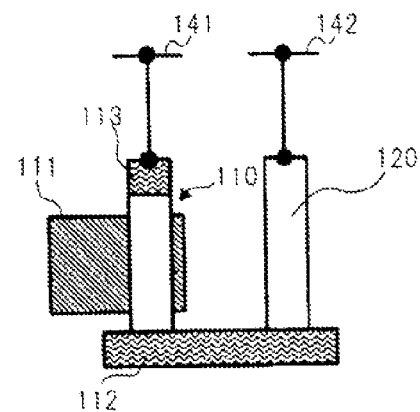
FIG. 1b is a sectional view taken along line A-A in FIG. 1A.
Figure 2A:
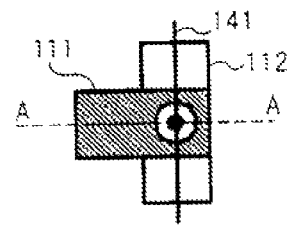
FIG. 2a is a plan view for explaining the structure of another related example of a vertical MISFET.
Figure 2B:
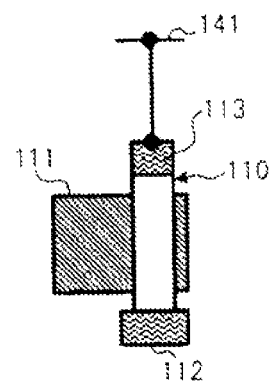
FIG. 2b is a sectional view taken along line A-A in FIG. 2A.
Figure 7A:
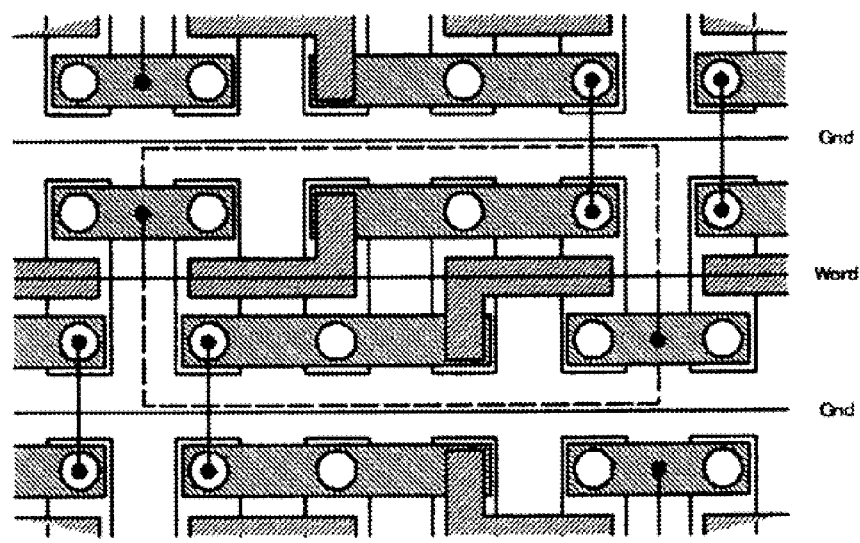
FIG. 7a is a diagram of arrangement of cells and wirings (word lines and ground lines) of the SRAM in accordance with the first exemplary embodiment of the present invention.
Figure 7B:
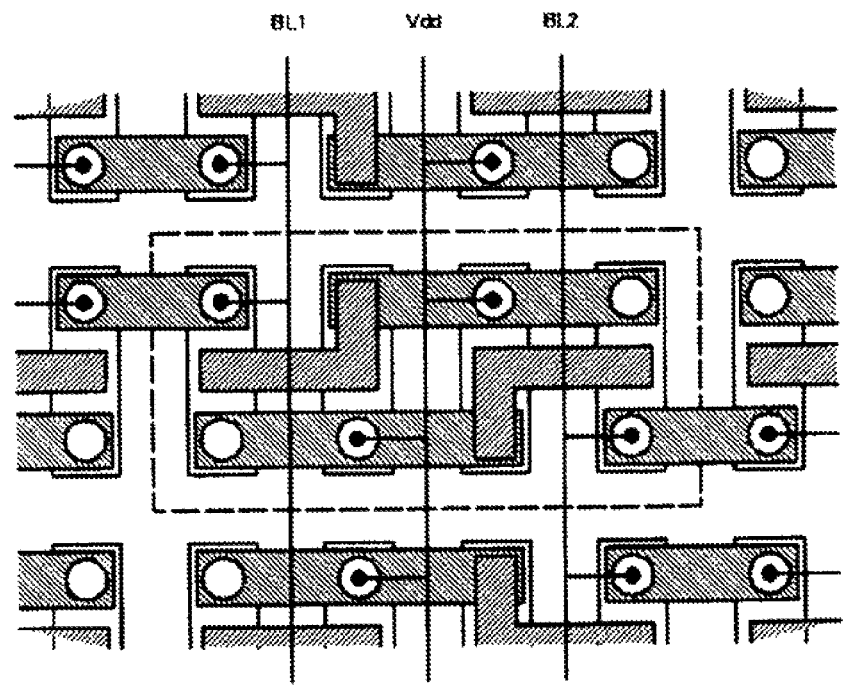
FIG. 7b is a diagram of arrangement of the cells and other wirings (bit lines and power lines) of the SRAM in accordance with the first exemplary embodiment of the present invention.

FIG. 7a and FIG. 7b show an example in which a plurality of SRAM cells shown in FIG. 5a are arranged in a matrix. FIG. 1a shows the ground line Gnd and the word line Word. FIG. 7b shows the power line Vdd, the first bit line BL1, and the second bit line BL2. The area enclosed by a dashed rectangle is a unit cell. This arrangement allows implementation of the circuit configuration shown in FIG. 3 and in which all the wirings each extended between a plurality of cells are formed above the transistors.

In the exemplary embodiment, the unit cells are desirably arranged mirror-symmetrically with respect to the boundary (the vertical dashed line in the figures) between the unit cells in the arrangement direction (the horizontal direction of the figures) of the column portions of the first driving transistor and the first load transistor. Thus, the connection between the word line and the gate of the access transistor can be shared by the adjacent cells. This serves to increase the integration degree. In the present example, the gate electrodes of the access transistors in the adjacent cells are integrally formed. Although FIG. 7a and FIG. 7b show the arrangement example in which the unit cells are arranged mirror-symmetrically with respect to the boundary (the horizontal dashed line in the figures) between the unit cells in the arrangement direction (the vertical direction of the figures) of the column portions of the first access transistor and the first driving transistor, the unit cells may be arranged translation-symmetrically in the vertical direction (the cells are simply translated). This is because the cells arranged in the vertical direction are prevented from sharing the connection between the wirings both in the mirror symmetry and in the translation symmetry.

As shown in FIG. 5a, FIG. 5b, and FIG. 5c, the base portion 101b (active area) of the load transistor has the same size and shape as those of the integrally formed base portion 101a (active area) of the access transistor and the driving transistor. This enhances pattern regularity to facilitate processing during manufacture. Furthermore, the area of the base portions increases to increase the electric capacitance of the accumulation nodes. This allows the operation of the SRAM to be stabilized in association with disturbance. However, the base portion of the load transistor may be smaller than the integrally formed base portion of the access transistor and the driving transistor as long as the connection between the base portion and the local interconnect can be ensured.

In FIG. 5a, the area enclosed by the rectangular dashed line shows the area of a single SRAM cell. When both the minimum width of each structure in FIG. 5a and the minimum distance between the structures are defined as F, the size of the cell is such that the cell generally has a width of 8F and a length of 4F. The area of the cell is ideally $32F^2$. That is, the present invention not only enables all the wirings (power lines, ground lines, bit lines, and word lines) connecting the transistors in the different cells together to be formed above the transistors but also allows the SRAM cells to be very densely formed.

As shown in FIG. 5b, the transistors are formed to have almost the same height. That is, the transistors according to the exemplary embodiment avoid including multiple layers as disclosed in Japanese Patent Laid-Open No. 06-069441 and Japanese Patent Laid-Open No. 2003-224211. Thus, the manufacturing process is simplified.

The rectangular arrangement shown in FIG. 5a may be modified so as to facilitate accommodation of the local interconnects to the extent that the desired effects of the present invention can be exerted. That is, as shown in FIG. 5e, the column portions of the first and second access transistors may be moved to increase the distance between the column portions of the first and second access transistors and the column portions of the first and second driving transistors.

In the above-described example, the first and second access transistors are N channel MISFETs. However, the first and second access transistors may be P channel MISFETs. In this case, the SRAM cells can be arranged in exactly the same manner as that described above by changing the position of the driving transistor with the position of the load transistor and correspondingly changing the position of the N well with the position of the P well.

Example of Manufacture of a SRAM

Now, an example of a method for manufacturing a SRAM according to the first exemplary embodiment will be described with reference to FIG. 8a to FIG. 9d.

Figure 8A:
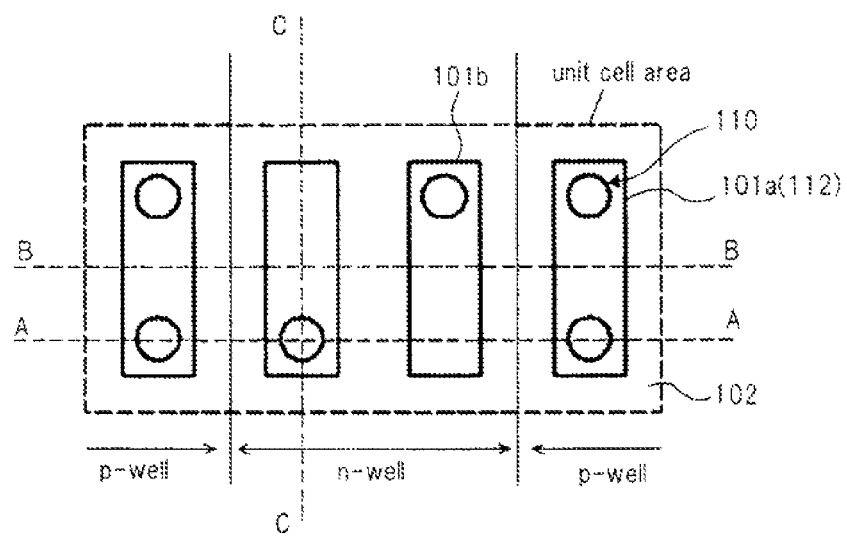
FIG. 8a is a plan view for explaining an example of a method for manufacturing the SRAM in accordance with the first exemplary embodiment.
Figure 8B:
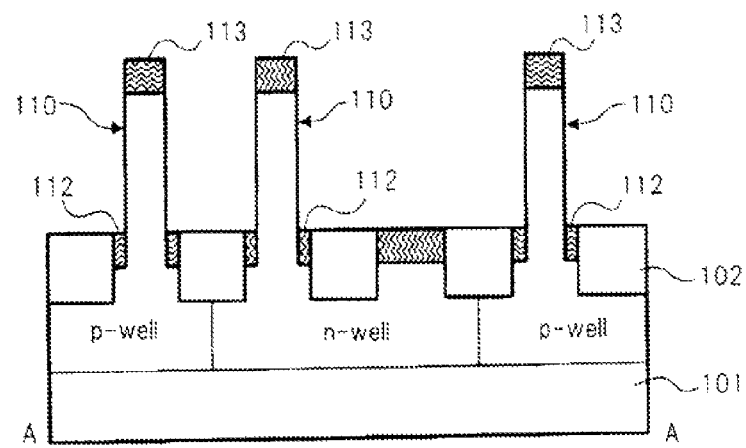
Figure 8C:
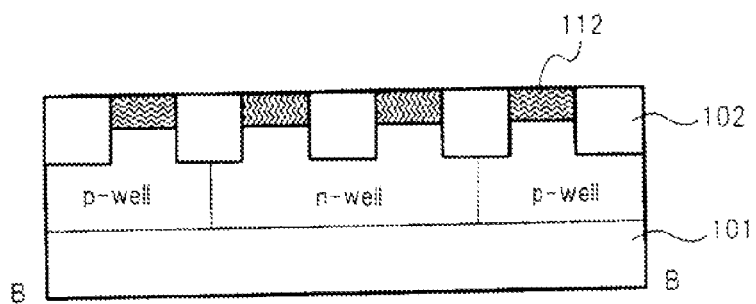
Figure 8D:
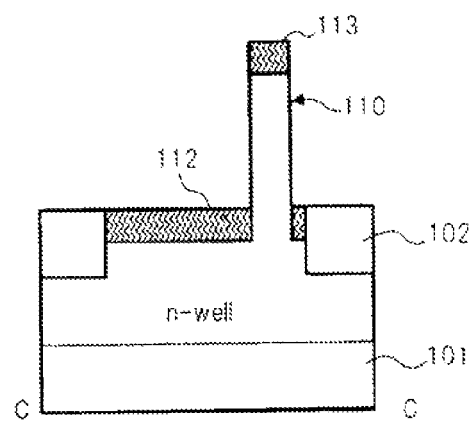

FIG. 8a to FIG. 8d show a structure corresponding to the structure shown in FIG. 5a to FIG. 5d and undergoing a manufacturing process (the source/drain has been formed and a gate electrode is to be formed). FIG. 8b is a sectional view taken along line A-A in FIG. 8a. FIG. 8c is a sectional view taken along line B-B in FIG. 8a. FIG. 8d is a sectional view taken along line C-C in FIG. 8a.

The structure in FIG. 8a to FIG. 8d can be formed as follows.

First, in the semiconductor substrate 101 such as a silicon substrate, with a predetermined area protected by a lithography technique, the semiconductor portion in an unprotected area is selectively etched to form column portions 110 made of the semiconductor.

Then, with a predetermined area protected by the lithography technique, the semiconductor in an unprotected area is selectively etched to remove the semiconductor in an area for forming an element-isolating insulator.

Then, an insulator is deposited to a thickness larger than the height of the column portions. The surface of the resultant insulating film is then flattened by a chemical mechanical polishing (CMP) technique. The insulating film is further selectively etched back to form an element-isolating insulator 102.

Then, P-type impurities are ion-implanted perpendicularly from above to form a P-type well in the N channel MISFET area. At this time, the P channel MISFET area is protected using the lithography technique. Then, N-type impurities are ion-implanted from above to form an N-type well in the P channel MISFET area. At this time, the N channel MISFET area is protected using the lithography technique. The order in which the N-type well and the P-type well are formed may be reversed. Furthermore, the formation of the wells may be carried out before the formation of the column portions 110 or the element-isolating insulator 102.

Then, N-type impurities are ion-implanted perpendicularly from above to form an upper-side source/drain 112 and an underside source/drain 113 for an N channel MISFET. At this time, the P channel MISFET area is protected using the lithography technique. Then, P-type impurities are ion-implanted perpendicularly from above to form an upper-side source/drain 112 and an underside source/drain 113 for a P channel MISFET. At this time, the N channel MISFET area is protected using the lithography technique. The order in which the source/drain of the N channel MISFET and the source/drain of the P channel MISFET are formed may be reversed.

Through the above-described steps, the structure shown in FIG. 8a to FIG. 8d can be obtained.

The above-described method allows the upper-side source/drain and underside source/drain of the MISFET to be simultaneously formed. Moreover, a structure (FIG. 8d) can be easily formed in which the channel formation area in the column portion of the MISFET and the semiconductor substrate are coupled together without being separated from each other by the underside source/drain.

Subsequently, a structure shown in FIG. 9a to FIG. 9d is formed as follows.

Figure 9A:
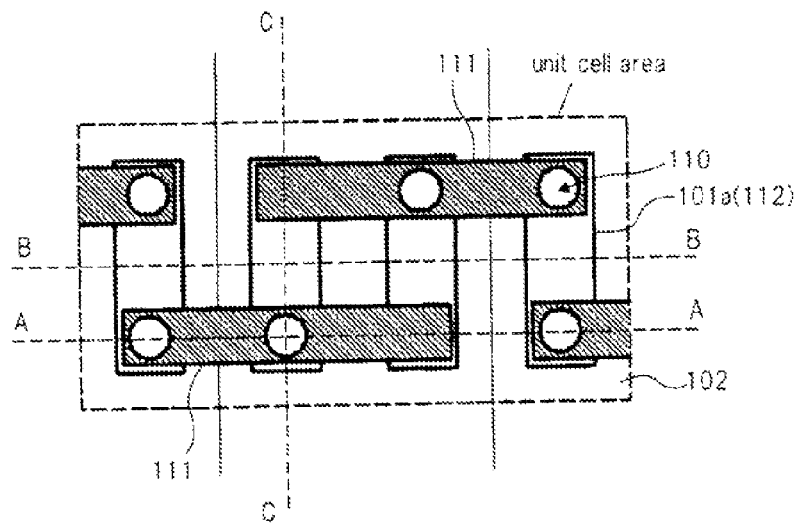
FIG. 9a is a plan view showing the structure after a step following a step of forming the structure shown in FIGS. 8a to 8d.
Figure 9B:
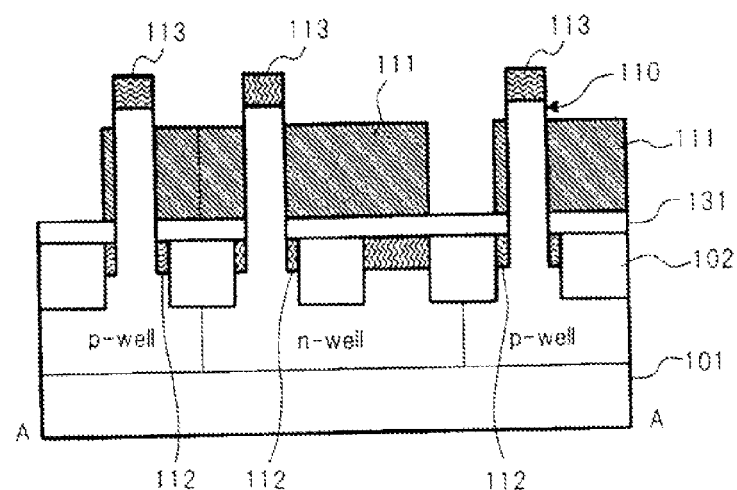
Figure 9C:
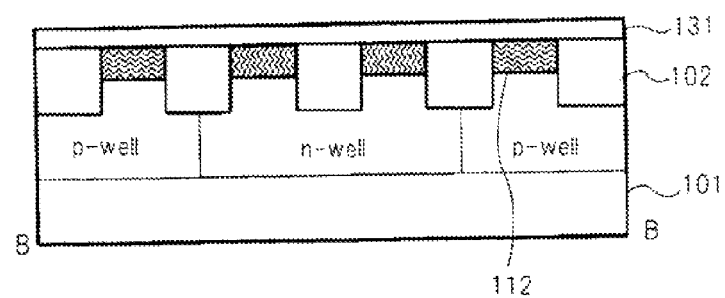
Figure 9D:
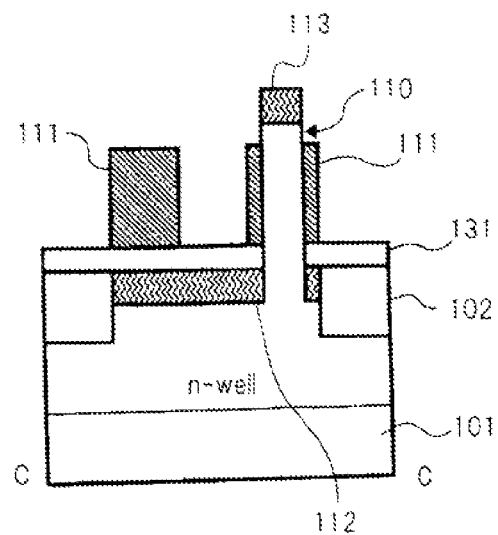
Figure 10A:
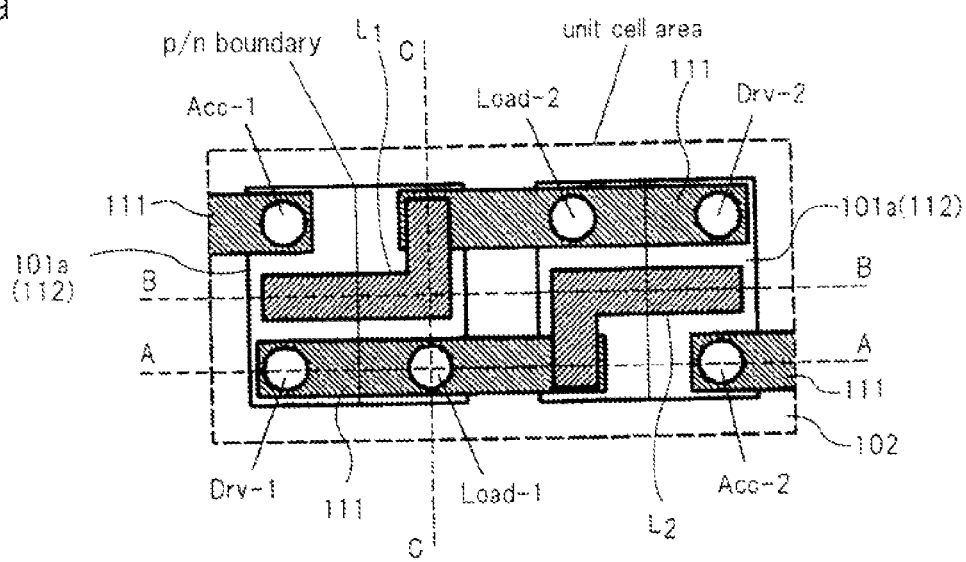
FIG. 10a is a plan view of a unit cell for explaining a SRAM in accordance with a second exemplary embodiment of the present invention.
Figure 10B:
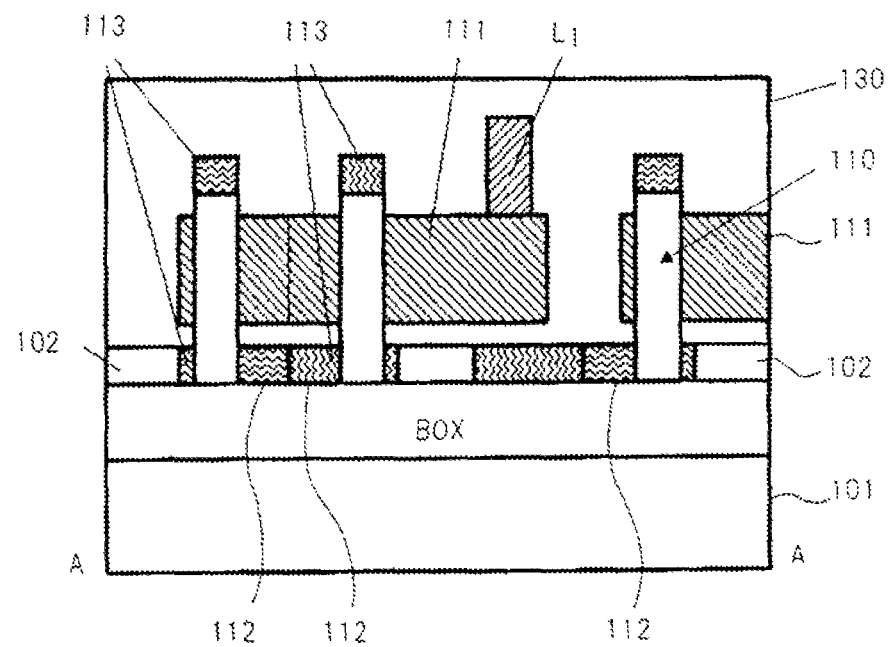
Figure 10C:
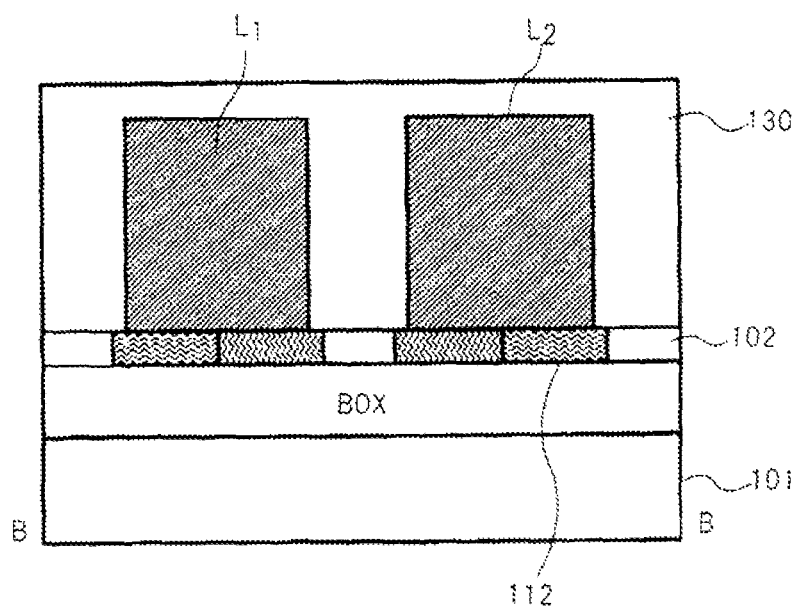
Figure 10D:
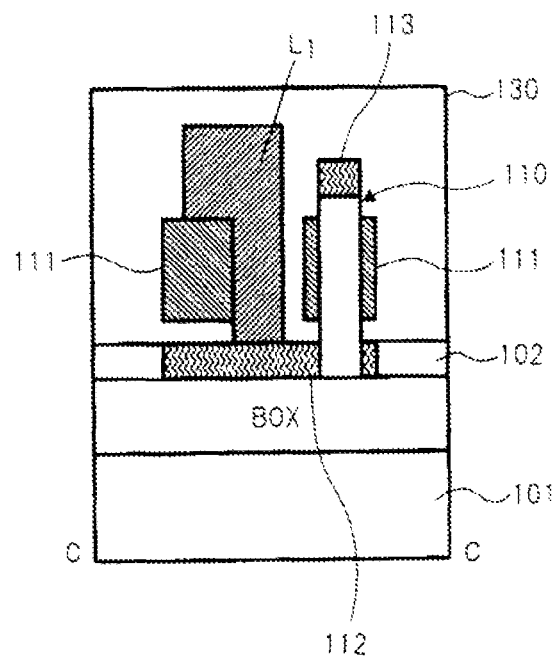

FIG. 9b is a sectional view taken along line A-A in FIG. 9a. FIG. 9c is a sectional view taken along line B-B in FIG. 9a. FIG. 9d is a sectional view taken along line C-C in FIG. 9a.

Then, an insulator is deposited to a thickness larger than the height of the column portions. The surface of the resultant insulating film is then flattened by the CMP technique. The insulating film is further selectively etched back to form a first insulating film 131 having the same height as that of the lower end of a later formed gate electrode 111 and covering the entire area in which no column portion is present.

Then, a gate insulating film is formed by thermal oxidation or CVD so as to cover the surfaces of the column portions.

Then, a metal for forming gate electrodes is deposited to a thickness larger than the height of the column portions. The surface of the resultant metal film is flattened by the CMP technique. The metal film is further selectively etched back to expose the upper-side source/drain 113 of the column portion 110. As a result, the metal film is obtained having a height corresponding to the vicinity of the upper-side source/drain of the column portion and covering the entire area in which no column portion is present. Then, with a predetermined area protected by the lithography technique, the metal film in an unprotected area is selectively etched to form gate electrodes 111.

Through the above-described steps, the structure shown in FIG. 9a to FIG. 9d can be obtained.

Then, an insulator is deposited to a thickness larger than the height of the column portions 110. The surface of the resultant insulating film is flattened by the CMP technique to form a second insulating film covering the entire surface.

Then, with a predetermined area protected by the lithography technique, the insulating film in an unprotected area is selectively etched to form trenches required to form local interconnects. Then, a conductor is deposited so as to fill the trenches. The surface of the resultant conductor film is flattened by the CMP technique to form local interconnects L1 and L2 composed of the conductor buried in the trenches. A material for the local interconnects may be a high-melting-point metal such as tungsten which is utilized for normal connection plugs because the local interconnects need not offer so low resistance as exhibited by external wirings. For example, a thin barrier film such as titanium nitride may be formed in the trench and tungsten may then be stacked on the barrier film to form the local interconnects.

Then, a third insulating film is formed all over the resultant surface. As a result, an interlayer insulating film 130 is obtained which includes a first insulating film 131, a second insulating film, and a third insulating film.

Through the above-described process, the structure shown in FIG. 5a to FIG. 5d can be obtained.

Second Exemplary Embodiment

An SRAM according to the second exemplary embodiment of the present invention will be described with reference to FIG. 10a to FIG. 11d.

The SRAM in the present exemplary embodiment is provided on a substrate including an insulator and a semiconductor layer on the insulator. In the present exemplary embodiment, as a typical example of such a substrate, a silicon on insulator (SOI) substrate is used. However, the semiconductor layer on the insulator may be SiGe, Ge, or any other semiconductor film. In FIG. 10a to FIG. 11d, reference numeral 101 denotes an SOI substrate including a support layer, a buried insulation layer (buried oxide: BOX), and a semiconductor layer. The semiconductor layer on the BOX layer is processed to form a base portion 101a and column portions 110 for each transistor.

The SRAM in the present exemplary embodiment differs from the first exemplary embodiment shown in FIG. 5a to FIG. 5d not only in the substrate but also in the following points.

In the first exemplary embodiment, the base portions of the first access transistor and the first driving transistor are integrated together, and the base portions of the second access transistor and the second driving transistor are integrated together. In contrast, in the present exemplary embodiment, the base portions of the first access transistor, the first driving transistor, and the first load transistor are integrated together so as to form a base portion 101a belonging to the first accumulation node. The base portions of the second access transistor, the second driving transistor, and the second load transistor are integrated together so as to form a base portion 101a belonging to the second accumulation node.

That is, the N-type area forming the underside source/drain of the first access transistor and the underside source/drain of the first driving transistor is in direct contact with the P-type area forming the underside source/drain of the first load transistor. The N-type area forming the underside source/drain of the second access transistor and the underside source/drain of the second driving transistor is in direct contact with the P-type area forming the underside source/drain of the second load transistor.

Even in this structure, possible short-circuiting is prevented because the whole structure located under the semiconductor film forming the base portions is an insulator.

In the above-described structure in the present example, the underside source/drain (the N-type area of the base portion) of the N channel MISFET (Acc-1, Acc-2, Drv-1, and Drv-2) and the underside source/drain (the P-type area of the base portion) of the P channel MISFET (Load-1 and Load-2) are not necessarily short-circuited simply by being brought into direct contact in a normal case. Thus, the local interconnects are formed so as to stride across the boundary between the underside source/drain of the N channel MISFET and the underside source/drain of the P channel MISFET to short-circuit the underside sources/drains.

In the above description, by way of example, the underside source/drain is formed of a semiconductor with impurities doped therein. However, the underside source/drain may be formed of any other conductive material. For example, a metal-containing conductive material may be used as the conductive material to form a metal-containing conductive layer in the upper part of the semiconductor layer in the source/drain, or the entire source/drain. The metal-containing conductive material may be a metal compound such as metal silicide, or metal. However, for appropriate transistor characteristics, if the source/drain is formed of metal or a metal-containing conductive material, a material is desirably selected which has a work function in the vicinity of the lower end of a conduction band in a semiconductor for N-type transistors or in the vicinity of the upper end of a valence band in a semiconductor for P-type transistors.

For example, what is called a salicide structure may be used in which metal silicide is selectively formed on a semiconductor area with impurities doped therein. In such a case, the underside source/drain of the N channel MISFET and the underside source/drain of the P channel MISFET are short-circuited simply by being directly coupled together. This eliminates the need to form the local interconnects such that the local interconnects stride across the underside source/drain of the N channel MISFET and the underside source/drain of the P channel MISFET.

The salicide structure can be formed, for example, as follows by applying a salicide method for related planar MISFETs. That is, the structure shown in FIG. 11a to FIG. 11d is obtained, and the side surface of the column portion 110 is covered with an insulating protect film by vapor phase growth of an insulating film and anisotropic etching. Then, metal such as Ni is deposited, and the deposited metal is heated to silicide a semiconductor portion (the source/drain portion exposed before the metal deposition) contacting the metal, in a self-aligned manner. Unchanged metal not having contacted the semiconductor portion is etched away using a chemical. Thus, a silicide layer of Ni silicide or the like is formed, in a self-aligned manner, only on the source/drain portion exposed before the metal deposition. As a result, a silicide layer striding across the boundary between the P-type area and N-type area of the base portion is formed on the surfaces of the source/drain of the N channel MISFET and the source/drain of the P channel MISFET to short-circuit the P-type area and the N-type area. Then, the above-described insulating protect film is appropriately removed. In this salicide step, the whole source/drain formed by ion implantation in the semiconductor portion may be silicided so as to be formed of metal silicide. In this case, the N- and P-type impurities that are ion-implanted before the silicidation serve to adjust the effective work function for the metal silicide of the source/drain so that the work function is suitable for the N channel MISFET or the P channel MISFET.

If the local interconnects are formed so as to stride across the underside source/drain of the N channel MISFET and the underside source/drain of the P channel MISFET, the following advantages are obtained. The semiconductor area with the impurities doped therein can be used as an underside source/drain. The underside source/drain can be formed simultaneously with formation of an upper-side source/drain. No additional step such as formation of a salicide structure is required.

The SRAM according to the second exemplary embodiment can be manufactured in accordance with the manufacturing method for the structure in the first exemplary embodiment except for the process of forming the above-described structure, which is different from the corresponding structure in the first exemplary embodiment.

FIG. 11a to FIG. 11d are diagrams illustrating a method for manufacturing the structure according to the second exemplary embodiment. FIG. 11a to FIG. 11d correspond to FIG.

8a to FIG. 8d, respectively, illustrating the method for manufacturing the structure according to the first exemplary embodiment.

Figure 11A:
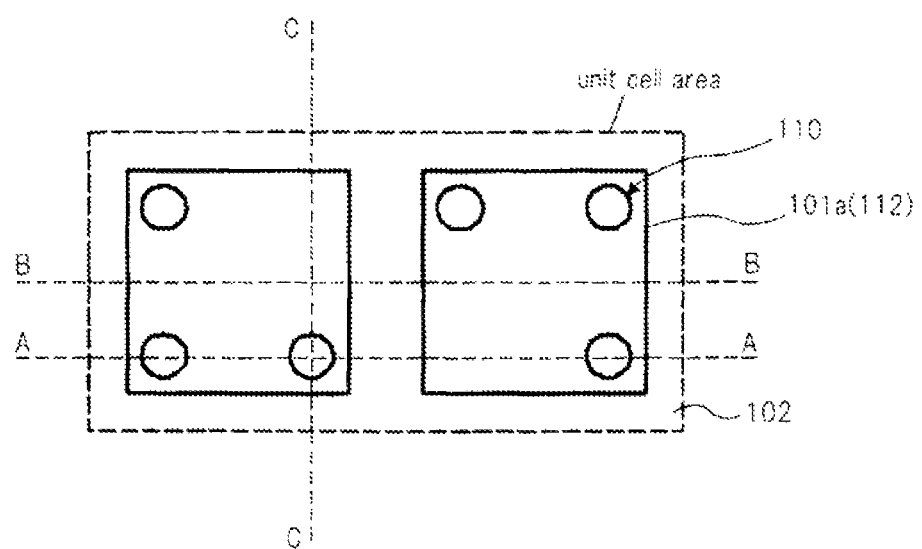
FIG. 11a is a plan view for explaining an example of a method for manufacturing the SRAM in accordance with the second exemplary embodiment.
Figure 11B:
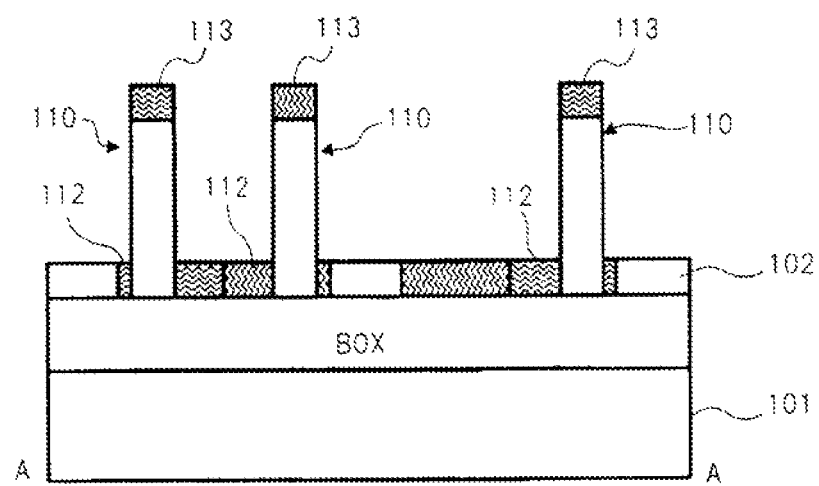
Figure 11C:
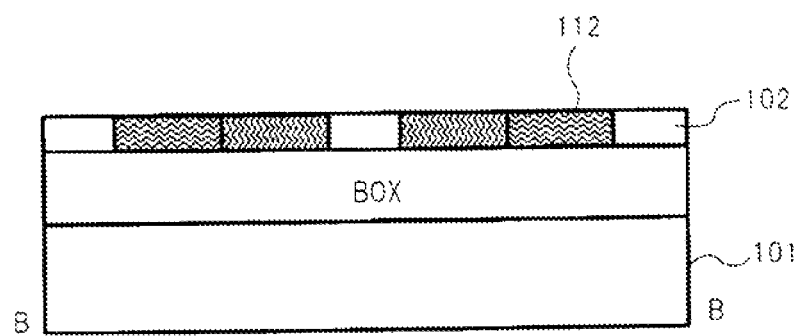
Figure 11D:
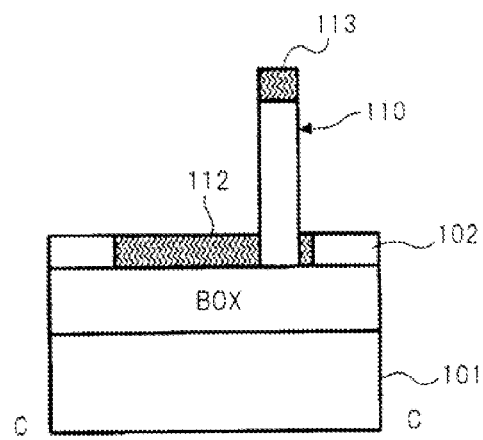

In the method for manufacturing the structure in the present exemplary embodiment, as shown in FIG. 11a, the semiconductor layer on the BOX layer is processed to form two semiconductor areas with a generally square planar shape in the cell. An element-isolating insulator 102 is formed between the semiconductor areas. The element-isolating insulator 102 need not be formed at this time. Instead, later during the step of forming an interlayer insulating film 130, the interlayer insulating film 130 may be buried in the area corresponding to the element-isolating insulator 102. One of the semiconductor areas in the cell forms a base portion in which a first access transistor, a first driving transistor, and a first load transistor are integrally formed. The other of the semiconductor areas forms a base portion in which a second access transistor, a second driving transistor, and a second load transistor are integrally formed. This simple pattern allows the semiconductor layer in the SOI substrate to be accurately and easily processed. Furthermore, an increase in the area of the base portion increases the electric capacitance of the accumulation node. Thus, the operation of the SRAM can be stabilized in association with disturbance.

Variation of the Second Exemplary Embodiment

Figure 12A:
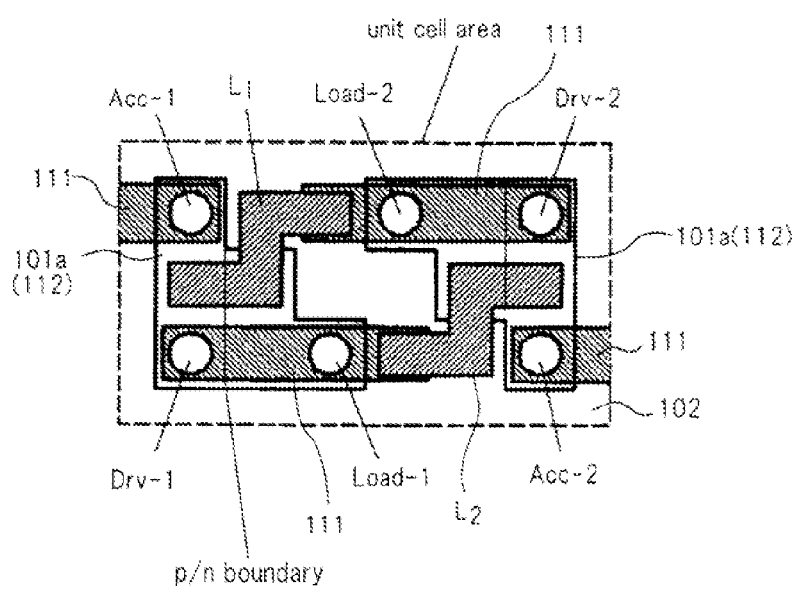
FIG. 12a is a plan view for explaining a variation of the structure of the SRAM in accordance with the second exemplary embodiment.
Figure 12B:
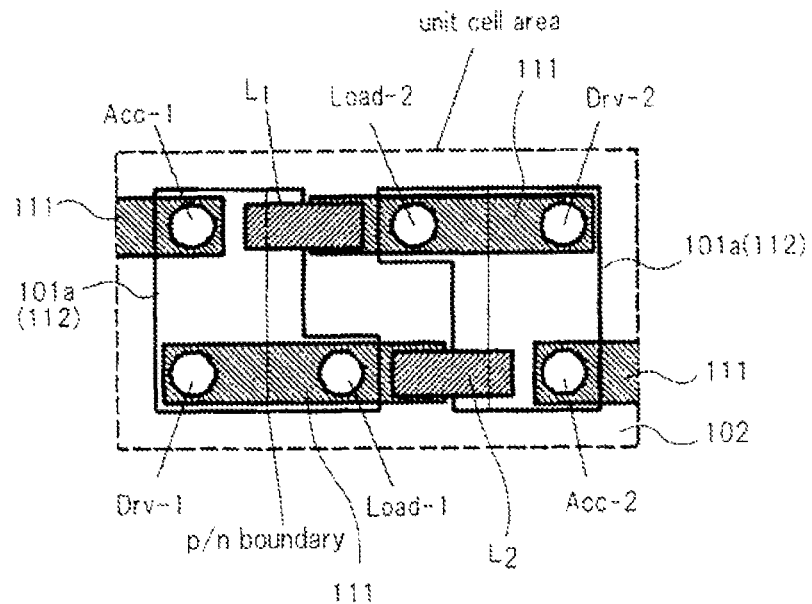
FIG. 12b is a plan view for explaining another variation of the structure of the SRAM in accordance with the second exemplary embodiment.

In the second exemplary embodiment, the area of the cell can be reduced by appropriately changing the planar shape (corresponding to the contour of the planar area of the underside source/drain 112) of the base portion 101a. Examples are shown in FIG. 12a and FIG. 12b. In the examples, one of the four vertices of the square of each base portion 101a shown in FIG. 10a near which no transistor column portion is located is retracted such that a recess potion and a protruding portion are formed in the area from which the vertex has been retracted. Then, the protruding portion of one of the paired base portions is placed opposite the recess portion of the other base portion to reduce the distance between the first access transistor and the second load transistor and the distance between the second access transistor and the first load transistor. Thus, the width of the unit cell decreases substantially from 8F to 7F, and the cell area decrease from 32F$^2$ to 28F$^2$. The shape of the base portion enabling these effects to be produced may be appropriately selected from various shapes including those shown in FIG. 12a and FIG. 12b.

The shape of the local interconnect may also be appropriately selected, and the relevant degree of freedom is particularly high if the substrate is a semiconductor substrate on an insulator. FIG. 12a and FIG. 12b show examples of the shape of the local interconnect which are different from those shown in FIG. 5a to FIG. 5d or FIG. 10a to FIG. 10d. As shown in FIG. 12b, a reduction in the size of the local interconnect makes difficult the operation of forming the local interconnect so that the local interconnect strides across the source/drain of the N channel MISFET and the source/drain of the P channel MISFET so as to ensure sufficient electric connection between the underside sources/drains. In such a case, the underside sources/drain areas are desirably formed of metal or have a salicide structure.

Third Exemplary Embodiment

In a third exemplary embodiment and the subsequent exemplary embodiments, the base portions of a first access transistor, a first driving transistor, and a first load transistor are integrally formed. The base portions of a second access transistor, a second driving transistor, and a second load transistor are integrally formed. In this structure, if the underside source/drain (the N-type area of the base portion) of an N channel MISFET and the underside source/drain (the P-type area of the base portion) of a P channel MISFET are directly coupled together (the underside source/drain areas of both transistors are formed in the integrally formed semiconductor portion so as to be in contact with each other), the source/drain areas have a salicide structure or are formed of a metal-containing conductive material, and thereby the both areas are automatically short-circuited. This reduces restrictions on the local interconnects, facilitating a reduction in cell area.

A third exemplary embodiment will be described with reference to FIG. 13a to FIG. 15b.

In the third exemplary embodiment, as is the case with the second exemplary embodiment, a SRAM is provided on a substrate including an insulator and a semiconductor layer on the insulator. However, the third exemplary embodiment enables the cell area to be minimized compared to Exemplary Embodiment 2.

Figure 13A:
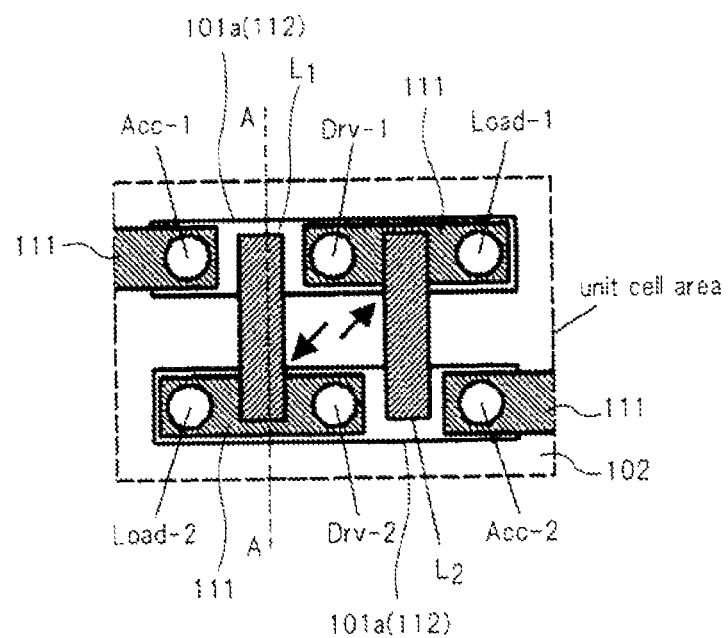
FIG. 13a is a plan view of a unit cell for explaining a SRAM in accordance with a third exemplary embodiment of the present invention.

As shown in FIG. 13a, the structure according to the third exemplary embodiment is different from that according to the first and second exemplary embodiments in the planar arrangement of the components. In the structure according to the third exemplary embodiment, the column portions of the first access transistor, the first driving transistor, and the first load transistor are linearly arranged. Furthermore, the column portions of the second access transistor, the second driving transistor, and the second load transistor are linearly arranged.

A first local interconnect L1 couples the top side of a gate electrode 111 between the column portions of two transistors (Drv-2 and Load-2) which share the gate electrode, onto a base portion 101a between the column portions of two transistors (Drv-1 and Acc-1) which share the base portion. A second local interconnect L2 couples the top side of a gate electrode 111 between the column portions of two transistors (Drv-1 and Load-1) which share the gate electrode, onto a base portion 101a between the column portions of two transistors (Drv-2 and Acc-2) which share the base portion. For symmetry, the local interconnects L1 and L2 preferably couple the intermediate points between the column portions together.

In addition, the structure according to the third exemplary embodiment is different from those according to the first and second exemplary embodiments in the sectional structure of the local interconnect.

Figure 14A:
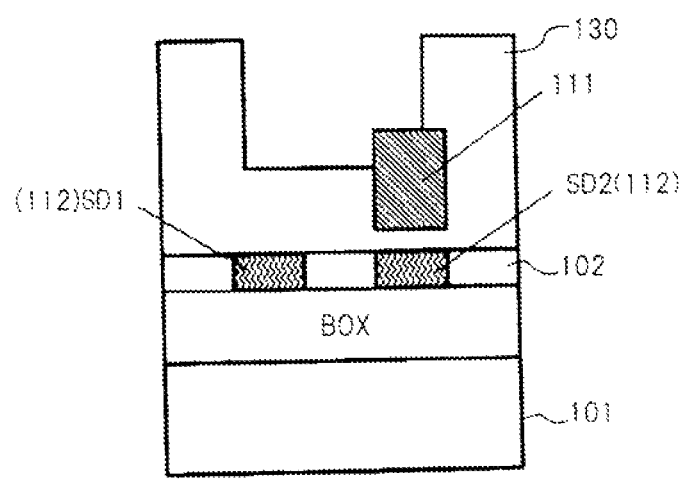
FIG. 14a is a sectional view corresponding to the sectional view taken along line A-A in FIG. 13a, for explaining an example of a method of forming a local interconnect in the SRAM in accordance with the third exemplary embodiment.
Figure 14B:
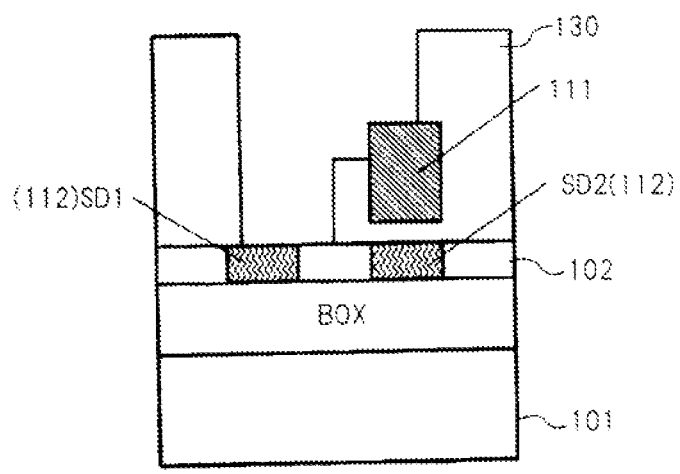
Figure 14C:
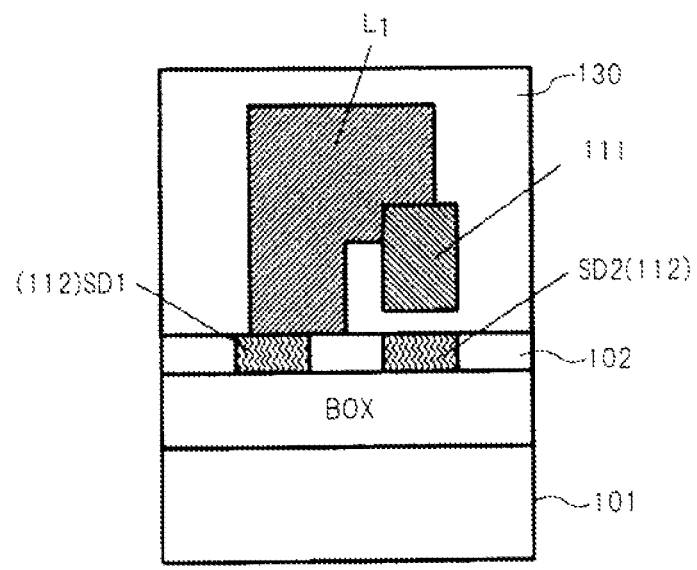
FIG. 14c is a sectional view taken along line A-A in FIG. 13a and showing the structure of a local interconnect in the SRAM in accordance with the third exemplary embodiment.

FIG. 14c shows a sectional view taken along line A-A in FIG. 13a. Each local interconnect short-circuits an integrally formed gate electrode shared by a driving transistor and a load transistor forming one of paired inverters, and a source/drain area SD1 (112) including the underside source/drain of a transistor forming the other inverter. Another source/drain area SD2 (112) is located immediately below the gate electrode. However, the local interconnect is not short-circuited with the source/drain area SD2. Thus, two sets each of the gate and the source/drain can be connected together without short-circuiting between a first accumulation node and a second accumulation node. Arrows in FIG. 13a show locations where the local interconnect is connected to the gate electrode but is to be insulated from the base portion (source/drain area) immediately below the gate electrode.

Figure 14D:
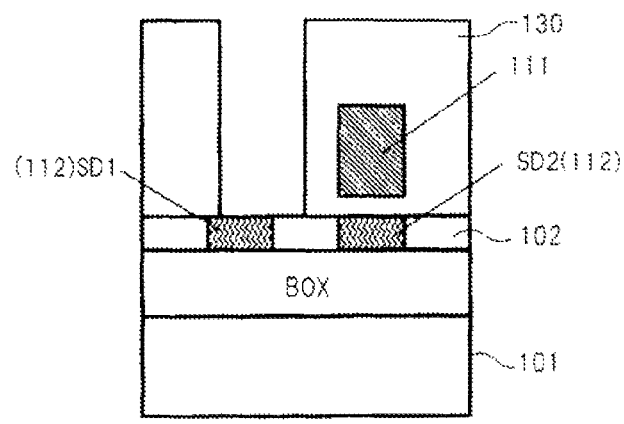
FIG. 14d is a sectional view corresponding to the section taken along line A-A in FIG. 13a, for explaining an example of another method for forming a local interconnect in the SRAM in accordance with the third exemplary embodiment.

To allow the structure of the local interconnect to be formed, trenches for the local interconnects may be formed in two stages. That is, first, as shown in FIG. 14a, a first lithography and etching step is carried out to form, in the interlayer insulating film 130, a trench reaching the gate electrode 111 but failing to reach the source/drain 112. Subsequently, as shown in FIG. 14b, a second lithography and etching step is carried out to form a narrow trench reaching only the source/drain area to be connected. Subsequently, a conductor is buried in the thus formed trenches to form local interconnects. Alternatively, in contrast, a narrow trench may be formed before formation of a wide trench. That is, as shown in FIG. 14d, the first lithography and etching step is carried out to form a narrow trench reaching only the source/drain area 112 to be connected. Subsequently, an organic film is buried in the narrow trench. The second lithography and etching step is then carried out to form, in the interlayer insulating film 130 and the organic film, a wide trench reaching the gate electrode 111 but failing to reach the source/drain 112. The organic film is then removed by an oxygen plasma treatment or the like to obtain the state shown in FIG. 14b. A conductor is buried in the trench to form a local interconnect. In the above-described steps, a normal LSI damascene wiring formation technique may be used.

Figure 15A:
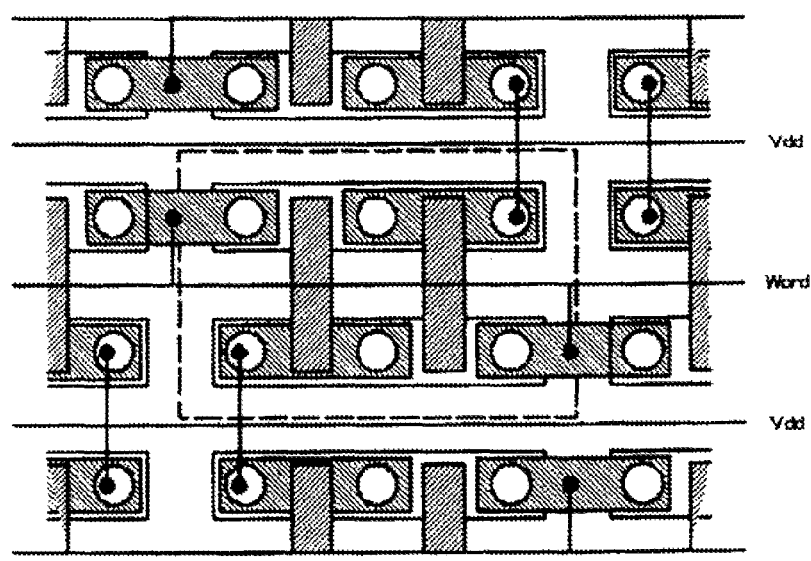
FIG. 15a is a diagram of arrangement of cells and wirings (word lines and power lines) of the SRAM in accordance with the third exemplary embodiment of the present invention.
Figure 15B:
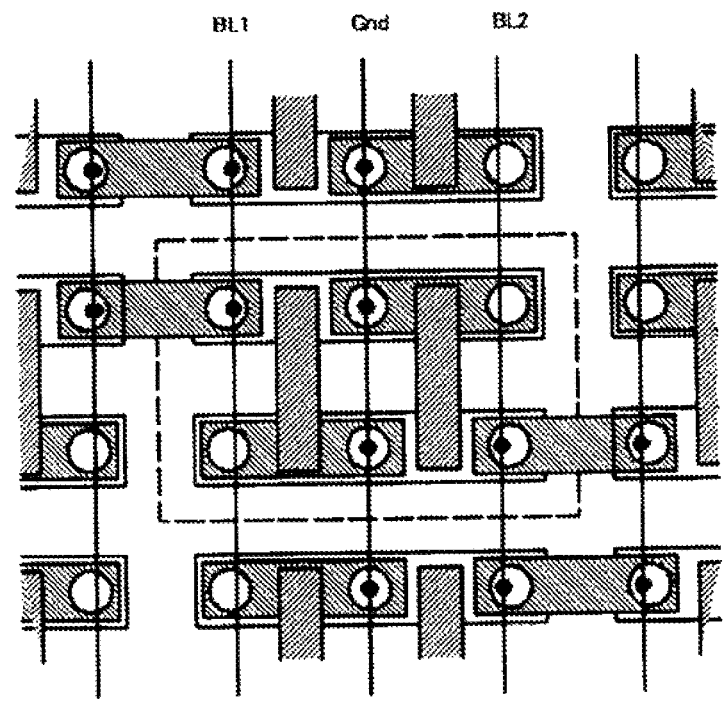
FIG. 15b is a diagram of arrangement of the cells and other wirings (bit lines and ground lines) of the SRAM in accordance with the third exemplary embodiment of the present invention.

FIG. 15a and FIG. 15b show an example in which a plurality of SRAM cells shown in FIG. 13a are arranged in a matrix. FIG. 15a shows a power line Vdd and a word line Word. FIG. 15b shows a first bit line BL1, a second bit line BL2, and a ground line Gnd. An area enclosed by a rectangular dashed line is a unit cell.

In the third exemplary embodiment, the unit cells are arranged mirror-symmetrically with respect to the boundary line (the vertical dashed line in the figures) between the unit cells in the arrangement direction (the horizontal direction of the figures) of the column portions of the first access transistor, the first driving transistor, and the first load transistor. Thus, the connection between the word line and the gate of the access transistor can be shared by the adjacent cells. This serves to increase the integration degree. In the present exemplary embodiment, the gate electrodes of the access transistors in the adjacent cells are integrally formed. Although FIG. 15a and FIG. 15b show the arrangement example in which the unit cells are arranged mirror-symmetrically with respect to the boundary (the horizontal dashed line in the figures) between the unit cells in the arrangement direction (the vertical direction of the figures) of the column portions of the first access transistor and the second load transistor, the unit cells may be arranged translation-symmetrically in the vertical direction.

According to the third exemplary embodiment, the cell has a width of about 6F and a length of about 4F. Thus, very small SRAM cells each of area 24F² can be implemented.

Moreover, in the third exemplary embodiment, the column portions of the transistors can be arranged at equal intervals in the vertical and horizontal directions over a plurality of cells. Furthermore, the gate electrode and the local interconnect can each be shaped like a simple rectangle. The horizontal wirings (word lines and power lines) can be arranged at equal intervals, and the vertical lines (ground lines and first and second bit lines) can also be arranged at equal intervals. This high regularity of the planar arrangement allows processing to be accurately and easily carried out in spite of increased density.

Figure 13B:
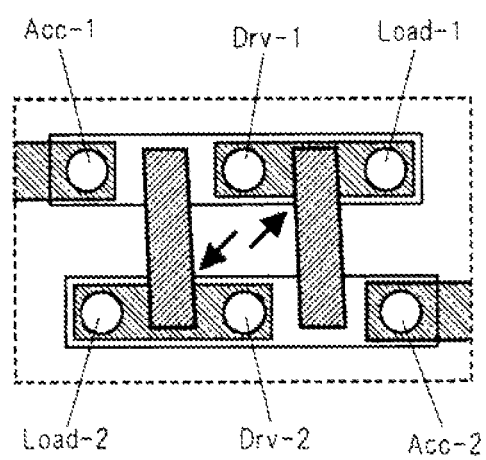
FIG. 13b is a plan view of a unit cell for explaining a variation of the SRAM in accordance with the third exemplary embodiment of the present invention.

The rectangular arrangement shown in FIG. 13a may be modified so as to facilitate accommodation of the local interconnects to the extent that the desired effects of the present invention can be exerted. That is, as shown in FIG. 13b, the column portions of the first and second access transistors may be moved to increase the distance between the column portions of the first and second access transistors and the column portions of the first and second driving transistors. In this case, the local interconnects may be obliquely placed.

In the specification, the distance between the transistors means the distance between the centers of gravity of the column portions in a substrate plane (a plane parallel to the surface of the substrate) at a base portion surface level.

Fourth Exemplary Embodiment

A fourth exemplary embodiment will be described with reference to FIG. 16 to FIG. 19b.

Figure 16:
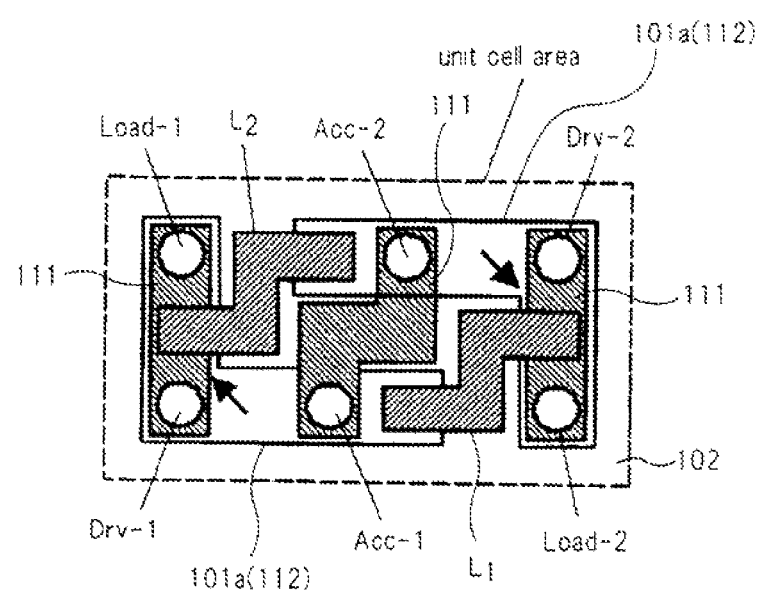
FIG. 16 is a plan view of a unit cell for explaining a SRAM in accordance with a fourth exemplary embodiment of the present invention.

A SRAM in the present exemplary embodiment is provided on a substrate including an insulator and a semiconductor layer on the insulator. As shown in FIG. 16, a first access transistor and a second access transistor are arranged near the center of the cell. According to the fourth exemplary embodiment, the cell has a width of about 7F and a length of about 4F. Thus, SRAM cells each of area 28F² can be implemented.

A base portion 101a shared by Load-1. Drv-1, and Acc-1 includes an extension extending from the column portion of Acc-1 toward a gate electrode shared by Load-2 and Drv-2. A first local interconnect L1 couples the extension onto the gate electrode between the column portions of Load-2 and Drv-2. A base portion 101a shared by Load-2, Drv-2, and Acc-2 includes an extension extending from the column portion of Acc-2 toward a gate electrode shared by Load-1 and Drv-1. A second local interconnect L2 couples the extension onto the gate electrode between the column portions of Load-1 and Drv-1. For symmetry, each of the local interconnects L1 and L2 preferably couples the extension to the intermediate point between the column portions.

Figure 17A:
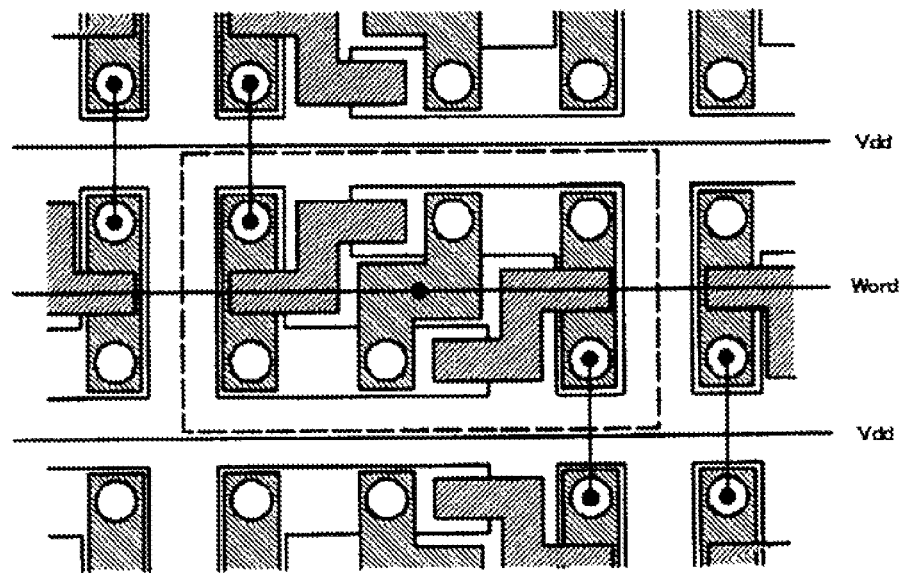
FIG. 17a is a diagram of arrangement of cells and wirings (word lines and power lines) of the SRAM in accordance with the fourth exemplary embodiment of the present invention.
Figure 17B:
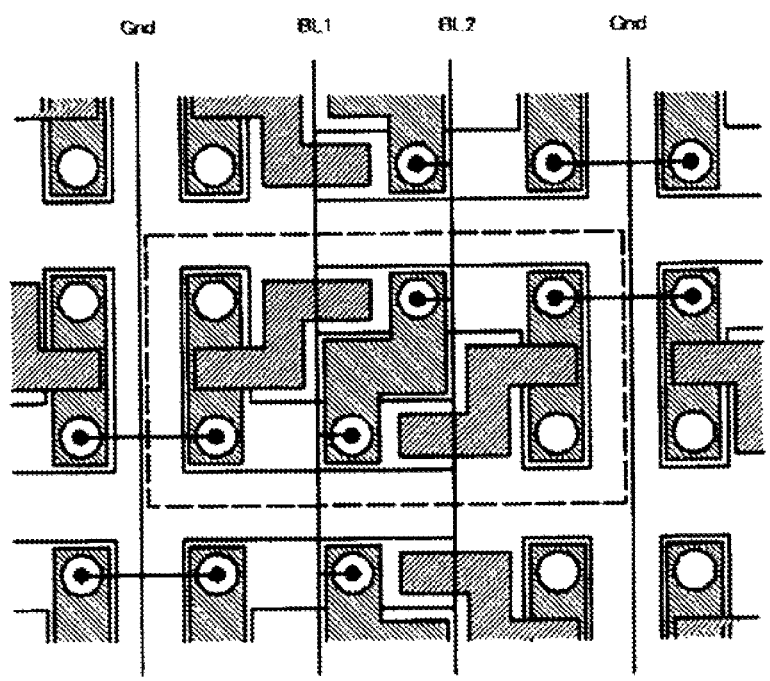
FIG. 17b is a diagram of arrangement of the cells and other wirings (bit lines and ground lines) of the SRAM in accordance with the fourth exemplary embodiment of the present invention.
Figure 18A:
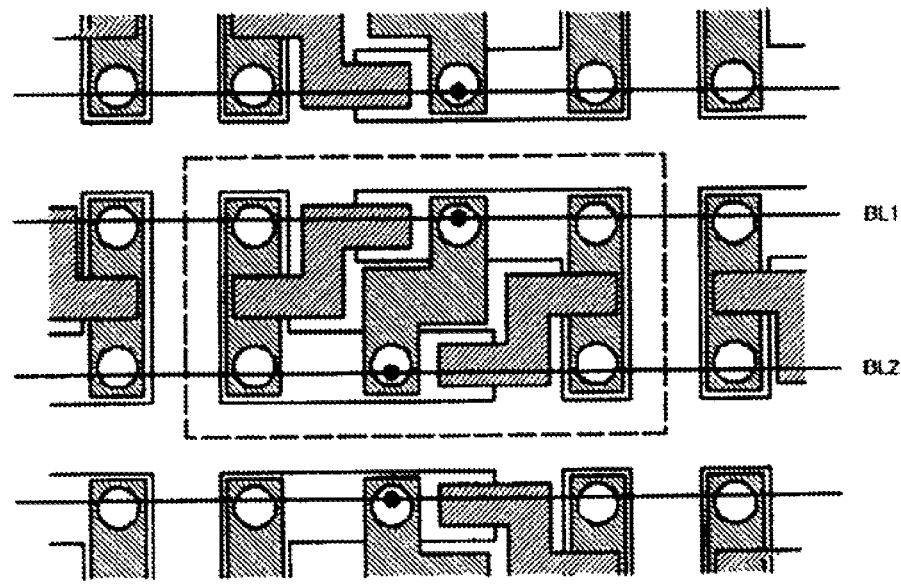
FIG. 18a is diagram of arrangement of cells and wirings (bit lines) of another SRAM in accordance with the fourth exemplary embodiment of the present invention.
Figure 18B:
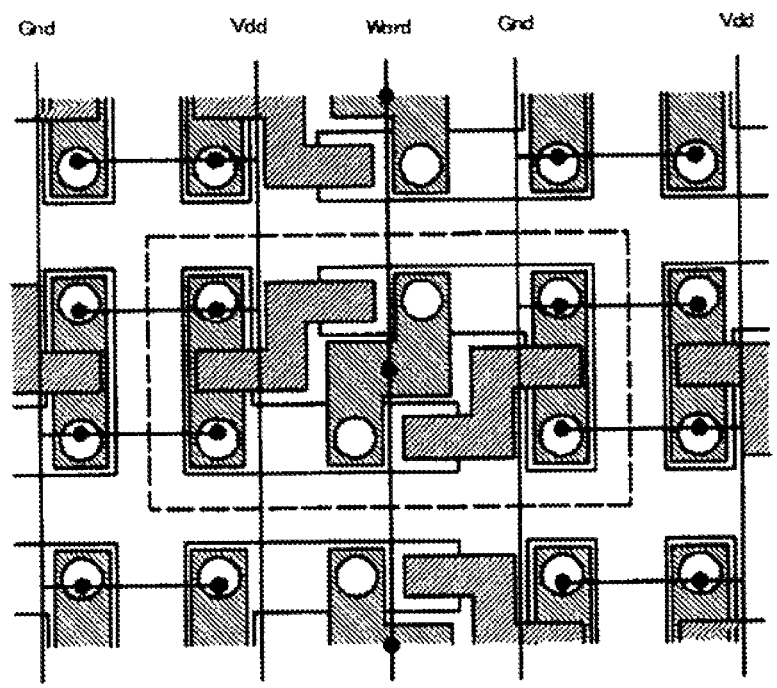
FIG. 18b is diagram of arrangement of the cells and other wirings (word lines, power lines, and ground lines) of the SRAM in accordance with the fourth exemplary embodiment of the present invention.

FIG. 17a and FIG. 17b and FIG. 18a and FIG. 18b show an example in which a plurality of SRAM cells shown in FIG. 16 are arranged in a matrix. FIG. 17a shows a power line Vdd and a word line Word. FIG. 17b shows a ground line Gnd, a first bit line BL1, and a second bit line BL2. FIG. 18a shows a first bit line BL1 and a second bit line BL2. FIG. 18b shows a power line Vdd, a word line Word, and a ground line Gnd.

FIG. 17a and FIG. 17b, the word line runs in the arrangement direction (the horizontal direction of the figures) of the column portions of the first driving transistor and the first access transistor. The bit line runs in the arrangement direction (the vertical direction of the figures) of the column portions of the first driving transistor and the first load transistor. In FIG. 18a and FIG. 18b, in contrast, the bit line runs in the horizontal direction, and the word line runs in the vertical direction. Thus, the fourth exemplary embodiment is characterized by allowing appropriate selection of the direction in which the word line runs and the direction in which the bit line runs. In the other exemplary embodiments, it is also not impossible to change the running directions of the word line and the bit line. However, in the other exemplary embodiments, owing to arrangement restrictions, a change in the running directions of the word line and the bit line results in the need for complicated layout of wirings.

Figure 19A:
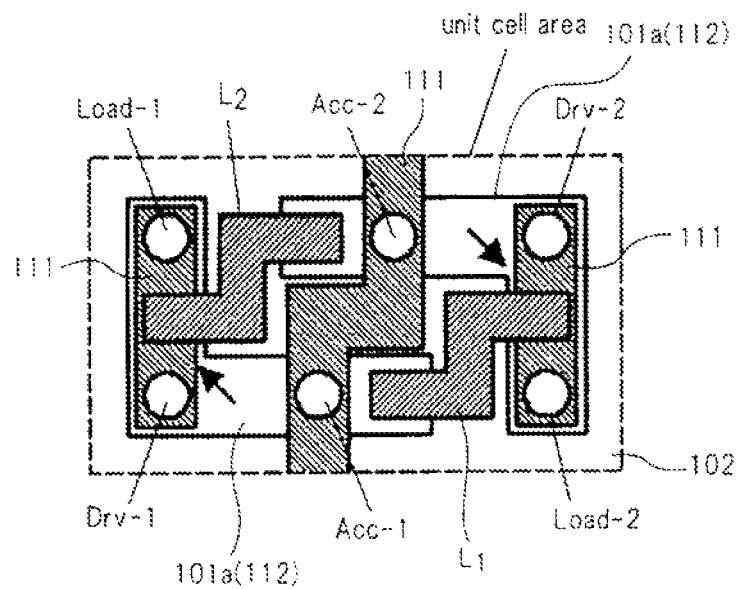
FIG. 19a is a plan view for explaining a variation of the structure of the SRAM in accordance with the fourth exemplary embodiment.
Figure 19B:
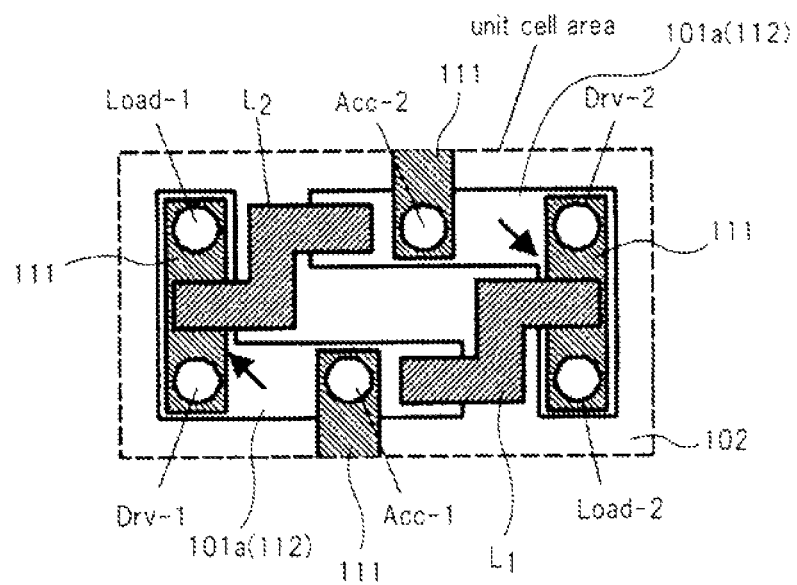
FIG. 19b is a plan view for explaining another variation of the structure of the SRAM in accordance with the fourth exemplary embodiment.

In the fourth exemplary embodiment, if the word line runs in the vertical direction, the planar shape of the gate electrode of the access transistor may be a pattern continuous in the vertical direction as shown in FIG. 19a instead of the shape shown in FIG. 18b. However, in the case shown in FIG. 19a, the cells are arranged mirror-symmetrically in the vertical direction. Furthermore, as shown in FIG. 19b, the gate electrode may be divided into two pieces within the cell and the pieces may be coupled together by the word line located above.

Fifth Exemplary Embodiment

A fifth exemplary embodiment will be described with reference to FIG. 20, FIG. 21a, and FIG. 21b.

A SRAM in the present exemplary embodiment is provided on a substrate including an insulator and a semiconductor layer on the insulator. As shown in FIG. 20, the column portions of a first access transistor, a first driving transistor, and a first load transistor are linearly arranged (first arrangement). The column portions of a second access transistor, a second driving transistor, and a second load transistor are linearly arranged (second arrangement). The column portions of the first access transistor and the second access transistor are positioned at the ends of the first and second arrangements, respectively. The column portions of the first and second access transistors are arranged along a direction perpendicular to the arrangement direction of the first and second arrangements within the cell and over a plurality of cells.

According to the fourth exemplary embodiment, the cell has a width of about 4F and a length of about 8F. Thus, SRAM cells each of area $32F^2$ can be implemented.

Figure 20:
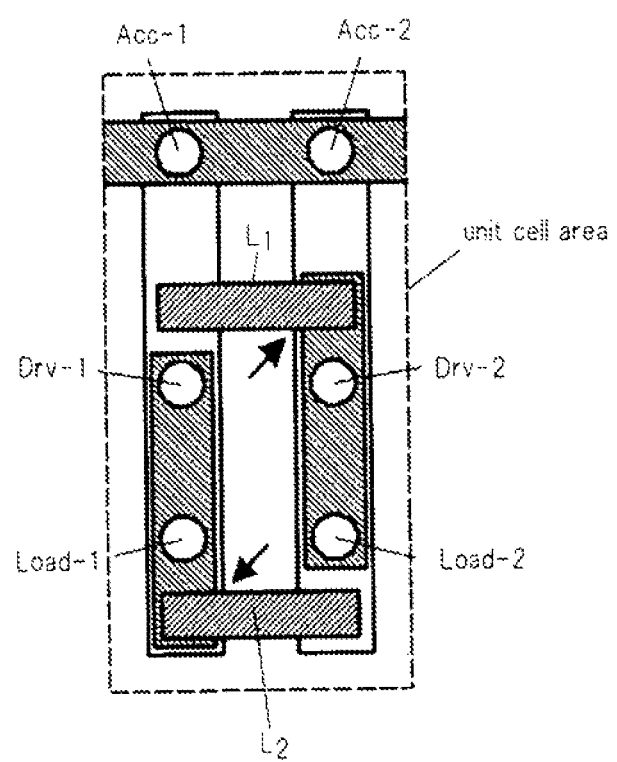
FIG. 20 is a plan view of a unit cell for explaining a SRAM in accordance with a fifth exemplary embodiment of present invention.
Figure 21A:
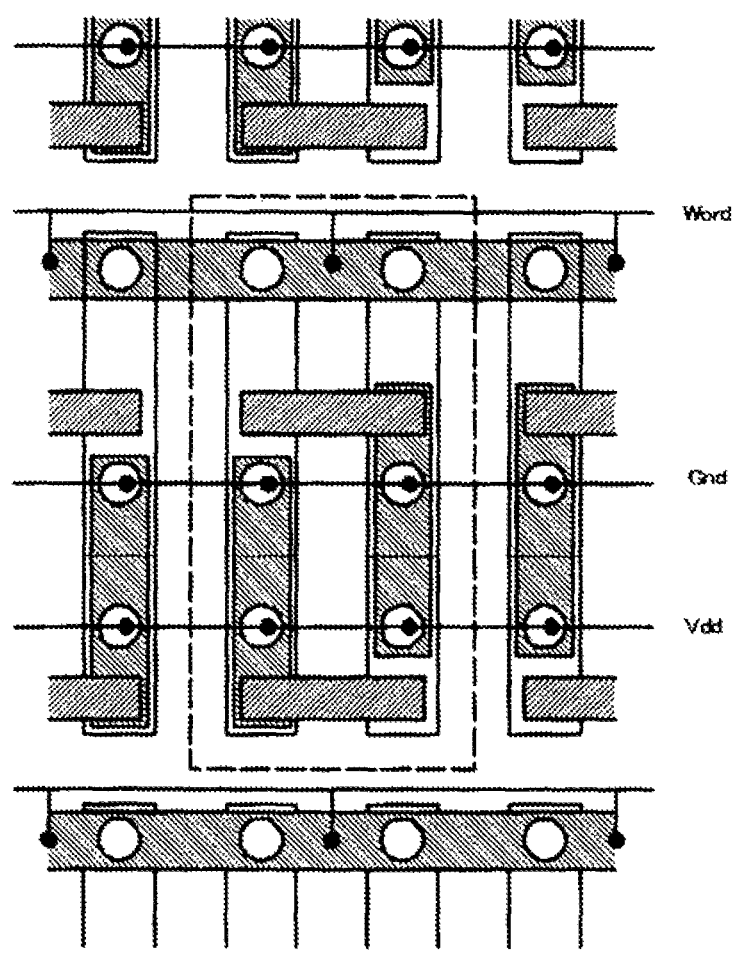
FIG. 21a is a diagram of arrangement of cells and wirings (word lines, power lines, and ground lines) of the SRAM in accordance with the fifth exemplary embodiment of the present invention.
Figure 21B:
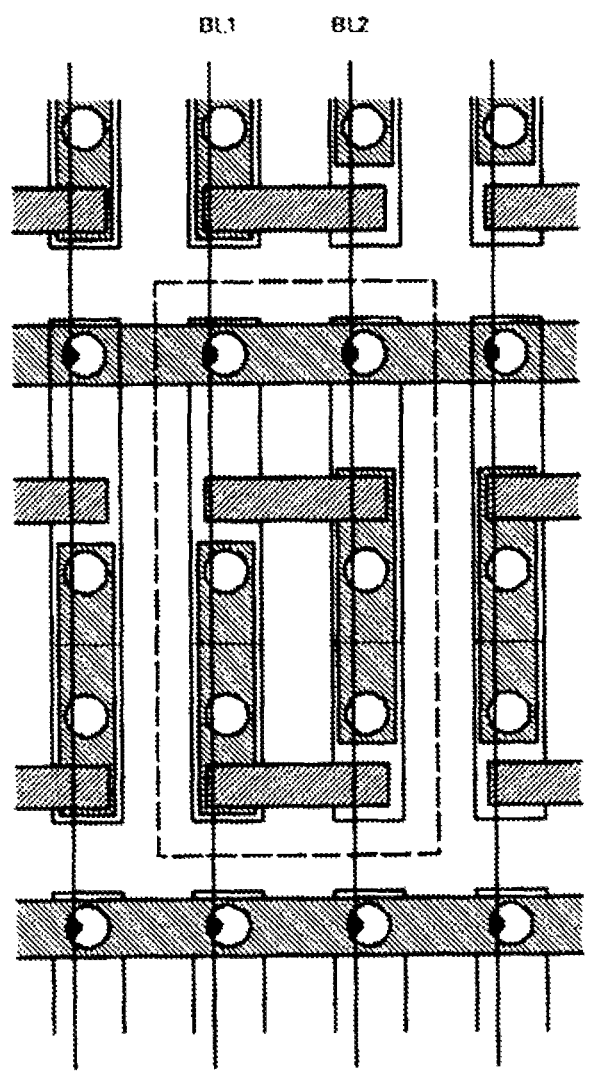
FIG. 21b is a diagram of arrangement of the cells and other wirings (bit lines) of the SRAM in accordance with the fifth exemplary embodiment of the present invention.

FIG. 21a and FIG. 21b show an example in which a plurality of SRAM cells shown in FIG. 20 are arranged in a matrix. FIG. 21a shows a power line Vdd, a ground line Gnd, and a word line Word. FIG. 21b shows a first bit line BL1 and a second bit line BL2. The arrangement of cells in the horizontal direction is mirror symmetric with respect to the boundary line between the unit cells. The arrangement of cells in the vertical direction is translation symmetric. However, the arrangement may be mirror symmetric or translation symmetric both in the vertical direction and in the horizontal direction.

Sixth Exemplary Embodiment

Figure 22:
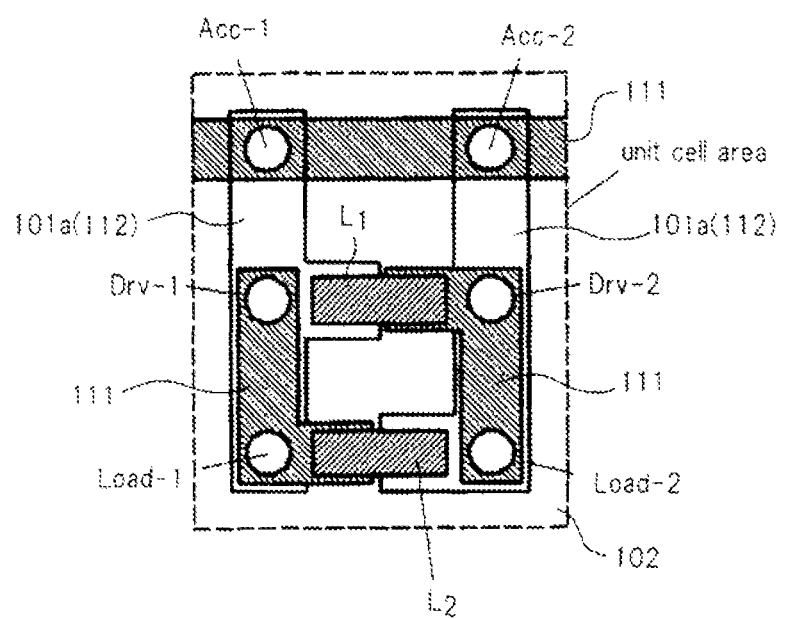
FIG. 22 is a plan view for explaining a variation of the structure of the SRAM in accordance with the fifth exemplary embodiment of present invention.

A sixth exemplary embodiment will be described with reference to FIG. 22.

The present exemplary embodiment is a variation of the fifth exemplary embodiment. In the sixth exemplary embodiment, a gate electrode and a base portion to be connected together each have a projecting portion extending in the horizontal direction (the direction perpendicular to the arrangement direction of the first and second arrangements) and opposite each other. The two sets of projecting portions are connected together by local interconnects L1 and L2, respectively. The arrangements and connections of a power line Vdd, a ground line Gnd, a first bit line BL1 and a second bit line BL2, and a word line Word are similar to those in the fifth exemplary embodiment.

According to the fifth exemplary embodiment, the cell has a width of about 5F and a length of about 6F. Thus, SRAM cells each of area $30F^2$ can be implemented.

The fourth, fifth, and sixth exemplary embodiments are characterized by allowing the gate electrode of the access transistor to be continuously formed over a plurality of cells. Thus, the gate electrode proper of the access transistor can also be used as a word line. This allows a separate word line located above to be omitted. Alternatively, although the word line located above is not omitted, the contact between the word line and the gate electrode of the access transistor is provided for every plural cells rather than for each cell. This enables a reduction in the number of contacts.

In the exemplary embodiments described above, the dimensions of the cell are determined under the following restrictions. The size, in the substrate plane (the size as viewed from above the substrate), of each of the components of the cell such as the base portion, gate, local interconnect, and transistor is at least about F. The distance, in the substrate plane, between the base portions, between the gates, between the local interconnects, and between the transistors is at least about F. In order to establish electric connection between the components, an overlap of at least about F is provided. When the cell structure meets these restrictions, cells can be manufactured using a manufacturing apparatus actually having a capability corresponding to a minimum line width of F.

In the above-described exemplary embodiments, the gate electrodes of the first driving transistor and first load transistor, which are components of the first complementary inverter, are integrally formed. The gate electrodes of the second driving transistor and second load transistor, which are components of the second complementary inverter, are integrally formed. The thus integrated gate electrodes to be short-circuited serve to increase density. On the other hand, the gate electrodes of the two access transistors in the cell need to be finally short-circuited but are not necessarily integrally formed. This is because the gate electrodes of the access transistors are in principle connected to the word lines, which are external wirings, so that the gate electrodes that are not integrated together can be short-circuited via the word lines.

In the above description: the sectional shape of the column portion of each transistor along the substrate plane is shown to be a circle. However, the sectional shape may be appropriately changed to, for example, an ellipse or a square.

In the drawings for the third and subsequent exemplary embodiments, the boundary between the source/drain of the N channel MISFET and the source/drain of the P channel MISFET is not clearly shown. However, the above-described boundary is present between transistors of the different types according to whether each transistor is selected to have an N channel or a P channel.

For example, if the base portion is formed on a bulk semiconductor substrate as in the case of the first exemplary embodiment, the positional relationship between the N channel MISFET and the P channel MISFET is restricted. This is because the base portions of the N channel MISFET and the P channel MISFET are insulated from each other by a well, and when the cells are arranged, the corresponding wells need to have a continuous pattern so as to be externally provided with a constant potential. In the first exemplary embodiment, in FIG. 7a and FIG. 7b, the N well and the P well occupy a vertically continuous band-like area, and a well potential can be provided through the outer peripheral portion of each of the arranged cells. Compared to the case in which the base portion is formed on the bulk semiconductor substrate, for example, the second exemplary embodiment, in which the base portion is formed on an insulator, serves to increase the degree of freedom of the positional relationship between the N channel MISFET and the P channel MISFET. That is, the positions of the driving transistor and the load transistor can be appropriately changed with each other. Furthermore, if the first and second access transistors are P channel MISFETs, the positions of the driving transistor and the load transistor need not necessarily be changed with each other. However, depending on the arrangement, it is difficult to form the local interconnect such that the local interconnect strides across the underside source/drain of the N channel MISFET and the underside source/drain of the P channel MISFET. In this case, the underside sources/drains are desirably formed of metal or to have a salicide structure.

If the positions of the driving transistor and the load transistor are changed with each other, the wirings Vdd and Gnd located above the transistors correspondingly need to be changed. For example, if in FIG. 13a, the positions of the first driving transistor and the first load transistor are changed with each other and the positions of the second driving transistor and the second load transistor are changed with each other, then in FIG. 15a and FIG. 15b, Vdd and Gnd is changed with each other.

Of course, in FIG. 7a, FIG. 7b, FIG. 15a, FIG. 15b, FIG. 17a, FIG. 17b, FIG. 18a, FIG. 18b, FIG. 21a, and FIG. 21b, the set of wirings running in the horizontal direction and the set of wirings running in the vertical direction need to be formed in different layers in different steps so as to prevent short-circuiting. In addition, the wirings running in the horizontal direction may be formed in different steps, and the wirings running in the vertical direction may be formed in different steps. For example, in FIG. 7a, the ground line Gnd and the word line Word may be formed in different steps. This, enables the wirings formed in the different steps to be arranged at a reduced distance from each other compared to the minimum pitch limited by the resolution of the lithography technique. Thus, wiring density can be increased.

Having thus described the present invention with reference to the exemplary embodiments, the present invention is not limited to the above-described exemplary embodiments. Various modifications understandable to those skilled in the art may be made to the constitution and details of the present invention within the scope thereof.

This application is the National Phase of PCT/JP2009/057511, filed Apr. 14, 2009, which is based upon and claims the benefit of priority from Japanese Patent Application No. 2008-107010, filed on Apr. 16, 2008, the disclosure of which is incorporated herein in its entirety by reference.

The invention claimed is:

1. A semiconductor storage device comprising a plurality of static random access memory cells,
    wherein each of the cells comprises a first access transistor, a second access transistor, a first driving transistor, a second driving transistor, a first load transistor and a second load transistor;
    each of the transistors comprises a column portion including a semiconductor projecting from a base portion surface, an underside conductive area provided in the base portion and serving as one of a source and a drain, an upper-side conductive area provided in an upper part of the column portion and serving as the other of the source and the drain, a gate electrode provided on a side surface of the column portion, and a gate insulating film interposed between the gate electrode and the column portion side surface;
    in each of the cells,
        the underside conductive areas of the first access transistor, the first driving transistor and the first load transistor are electrically connected together, and further electrically connected to the gate electrodes of the second driving transistor and the second load transistor to form a first accumulation node,
        the underside conductive areas of the second access transistor, the second driving transistor and the second load transistor are electrically connected together, and further electrically connected to the gate electrodes of the first driving transistor and the first load transistor to form a second accumulation node, and
        a first arrangement of the column portion of the first access transistor, the column portion of the first driving transistor and the column portion of the first load transistor, and a second arrangement of the column portion of the second access transistor, the column portion of the second driving transistor and the column portion of the second load transistor are symmetric to each other;
        the base portion of the first access transistor and the base portion of one of the first driving transistor and the first load transistor are integrally coupled together to form a first coupled base portion;
        the gate electrode of the first driving transistor and the gate electrode of the first load transistor are integrally coupled together to form a first coupled gate electrode comprising a first gate extension extending in the coupling direction;
        the base portion of the second access transistor and the base portion of one of the second driving transistor and the second load transistor are integrally coupled together to form a second coupled base portion;
        the gate electrode of the second driving transistor and the gate electrode of the second load transistor are integrally coupled together to form a second coupled gate electrode comprising a second gate extension extending in the coupling direction;
        a first local interconnect is provided coupling the second gate extension, the base portion of the other of the first driving transistor and the first load transistor, and the first coupled base portion together; and
        a second local interconnect is provided coupling the first gate extension, the base portion of the other of the second driving transistor and the second load transistor, and the second coupled base portion together.

2. The semiconductor storage device according to claim 1, wherein the first local interconnect couples the second gate extension to a top side area of the first coupled base portion, the top side area being between the column portions of the two transistors sharing the first coupled base portion;
    the second local interconnect couples the first gate extension to a top side area of the second coupled base portion, the top side area being between the column portions of the two transistors sharing the second coupled base portion; and
    the first local interconnect and the second local interconnect are symmetric to each other.

3. The semiconductor storage device according to claim 1, wherein a first bit line and a second bit line, a ground line and a power line are provided over a plurality of the cells such that the lines stride over the cells;
    the upper-side conductive area of the first access transistor is electrically connected to the first bit line;
    the upper-side conductive area of the second access transistor is electrically connected to the second bit line;
    the upper-side conductive areas of the first and second driving transistors are electrically connected to the ground line; and
    the upper-side conductive areas of the first and second load transistors are electrically connected to the power line.

4. The semiconductor storage device according to claim 1, wherein in each of the first and second arrangements, the three column portions are arranged at equal intervals.

5. The semiconductor storage device according to claim 1, wherein the two column portions in the first arrangement and the two column portions in the second arrangement are positioned at respective vertices of a rectangle, and the two other column portions are arranged on the respective long sides of the rectangle.

6. The semiconductor storage device according to claim 1, wherein the cells are arranged in a matrix in a first direction and a second direction perpendicular to the first direction; and
    the column portions are arranged over a plurality of the cells at equal intervals along one or both of the first direction and the second direction.

7. A semiconductor storage device comprising a plurality of static random access memory cells,
wherein each of the cells comprises a first access transistor, a second access transistor, a first driving transistor, a second driving transistor, a first load transistor and a second load transistor;
each of the transistors comprises a column portion including a semiconductor projecting from a base portion surface, an underside conductive area provided in the base portion and serving as one of a source and a drain, an upper-side conductive area provided in an upper part of the column portion and serving as the other of the source and the drain, a gate electrode provided on a side surface of the column portion, and a gate insulating film interposed between the gate electrode and the column portion side surface;
in each of the cells,
the underside conductive areas of the first access transistor, the first driving transistor and the first load transistor are electrically connected together, and further electrically connected to the gate electrodes of the second driving transistor and the second load transistor to form a first accumulation node,
the underside conductive areas of the second access transistor, the second driving transistor and the second load transistor are electrically connected together, and further electrically connected to the gate electrodes of the first driving transistor and the first load transistor to form a second accumulation node, and
a first arrangement of the column portion of the first access transistor, the column portion of the first driving transistor and the column portion of the first load transistor, and a second arrangement of the column portion of the second access transistor, the column portion of the second driving transistor and the column portion of the second load transistor are symmetric to each other;
the base portion of the first access transistor, the base portion of the first driving transistor and the base portion of the first load transistor are integrally formed to provide a first integrated base portion;
the gate electrode of the first driving transistor and the gate electrode of the first load transistor are integrally coupled together to provide a first coupled gate electrode;
the base portion of the second access transistor, the base portion of the second driving transistor and the base portion of the second load transistor are integrally formed to provide a second integrated base portion;
the gate electrode of the second driving transistor and the gate electrode of the second load transistor are integrally coupled together to provide a second coupled gate electrode;
a first local interconnect is provided coupling the second coupled gate electrode and the first integrated base portion together to form a first accumulation node; and
a second local interconnect is provided coupling the first coupled gate electrode and the second integrated base portion together to form a second accumulation node.

8. The semiconductor storage device according to claim 7, wherein the first coupled gate electrode comprises a first gate extension extending in the coupling direction of the first coupled gate electrode;
the second coupled gate electrode comprises a second gate extension extending in the coupling direction of the second coupled gate electrode;
the first local interconnect couples the second gate extension and the first integrated base portion together; and
the second local interconnect couples the first gate extension and the second integrated base portion together.

9. The semiconductor storage device according to claim 8, wherein the first integrated base portion comprises a first conductivity type semiconductor area and a second conductivity type semiconductor area joined to the first conductivity type semiconductor area, the first conductivity type semiconductor area comprises the column portion of the first access transistor and the column portion of one of the first driving transistor and the first load transistor, and the second conductivity type semiconductor area comprises the column portion of the other of the first driving transistor and the first load transistor;
the second integrated base portion comprises a first conductivity type semiconductor area and a second conductivity type semiconductor area joined to the first conductivity type semiconductor area, the first conductivity type semiconductor area comprises the column portion of the second access transistor and the column portion of one of the second driving transistor and the second load transistor, and the second conductivity type semiconductor area comprises the column portion of the other of the second driving transistor and the second load transistor;
the first local interconnect is provided on the first integrated base portion such that the first local interconnect strides over a boundary between the first conductivity type semiconductor area and the second conductivity type semiconductor area; and
the second local interconnect is provided on the second integrated base portion such that the second local interconnect strides over a boundary between the first conductivity type semiconductor area and the second conductivity type semiconductor area.

10. The semiconductor storage device according to claim 7, wherein the first integrated base portion comprises a first base extension extending from the column portion side of the first access transistor toward the second coupled gate electrode;
the first local interconnect couples the first base extension to a top side area of the second coupled gate electrode between the column portions of two transistors sharing the second coupled gate electrode;
the second integrated base portion comprises a second base extension extending from the column portion side of the second access transistor toward the first coupled gate electrode; and
the second local interconnect couples the second base extension to a top side area of the first coupled gate electrode between the column portions of two transistors sharing the first coupled gate electrode.

11. The semiconductor storage device according to claim 7, wherein the first local interconnect couples a top side area of the second coupled gate electrode between the column portions of the two transistors sharing the second coupled gate electrode to a top side area of the first integrated base portion between the column portions of the two transistors sharing the first integrated base portion; and
the second local interconnect couples a top side area of the first coupled gate electrode between the column portions of the two transistors sharing the first coupled gate electrode to a top side area of the second integrated base portion between the column portions of the two transistors sharing the second integrated base portion.

12. The semiconductor storage device according to claim 11, wherein in each of the first and second arrangements, the three column portions are linearly arranged.

13. The semiconductor storage device according to claim 7, wherein the column portions of the first driving transistor and the first load transistor are arranged in parallel with the column portions of the second driving transistor and the second load transistor;
- the first coupled gate electrode comprises a first gate extension extending in the coupling direction thereof;
- the second coupled gate electrode comprises a second gate extension extending in a direction opposite to a direction in which the first gate extension extends;
- the second integrated base portion comprises a base extension extending along the direction in which the first gate extension extends;
- the second local interconnect couples the base extension and the first gate extension together; and
- the first local interconnect couples the second gate extension to a top side area of the first integrated base portion between the column portion of the first access transistor and the column portion of one of the first driving transistor and the first load transistor.

14. The semiconductor storage device according to claim 13, wherein in each of the first and second arrangements, the three column portions are linearly arranged.

15. The semiconductor storage device according to claim 13, wherein the cells are arranged in a matrix along a first direction and a second direction perpendicular to the first direction; and the gate electrodes of the first and second access transistors are consecutively and integrally provided along one of the first and second directions over a plurality of the cells.

16. The semiconductor storage device according to claim 7, wherein the column portions of the first driving transistor and the first load transistor are arranged in parallel with the column portions of the second driving transistor and the second load transistor;
- the first coupled gate electrode comprises a first gate extension extending toward the second integrated base portion;
- the second coupled gate electrode comprises a second gate extension extending toward the first integrated base portion;
- the first integrated base portion comprises a first base extension extending toward the second coupled gate electrode;
- the second integrated base portion comprises a second base extension extending toward the first coupled gate electrode;
- the first local interconnect couples the first base extension and the second gate extension together; and
- the second local interconnect couples the second base extension and the first gate extension.

17. The semiconductor storage device according to claim 16, wherein in each of the first and second arrangements, the three column portions are linearly arranged.

18. The semiconductor storage device according to claim 16, wherein the cells are arranged in a matrix along a first direction and a second direction perpendicular to the first direction; and the gate electrodes of the first and second access transistors are consecutively and integrally provided along one of the first and second directions over a plurality of the cells.

19. The semiconductor storage device according to claim 7, wherein the first integrated base portion comprises a first conductivity type semiconductor area and a second conductivity type semiconductor area joined to the first conductivity type semiconductor area, the first conductivity type semiconductor area comprises the column portion of the first access transistor and the column portion of one of the first driving transistor and the first load transistor, the second conductivity type semiconductor area comprises the column portion of the other of the first driving transistor and the first load transistor, and a metal-containing conductive layer is provided on an area comprising boundary between the first conductivity type semiconductor area and the second conductivity type semiconductor area; and
- the second integrated base portion comprises a first conductivity type semiconductor area and a second conductivity type semiconductor area joined to the first conductivity type semiconductor area, the first conductivity type semiconductor area comprises the column portion of the second access transistor and the column portion of one of the second driving transistor and the second load transistor, the second conductivity type semiconductor area comprises the column portion of the other of the second driving transistor and the second load transistor, and a metal-containing conductive layer is provided on an area comprising boundary between the first conductivity type semiconductor area and the second conductivity type semiconductor area.

20. The semiconductor storage device according to claim 7, wherein each of the first and second integrated base portions comprises a metal-containing conductive layer.

21. The semiconductor storage device according to claim 7, wherein the cells are arranged in a matrix in a first direction and a second direction perpendicular to the first direction, and the cells are arranged mirror-symmetrically along the first direction with respect to a cell boundary in the second direction; and
in each of the cells,
- in each of the first and second arrangements, the three column portions are arranged linearly at equal intervals,
- the two column portions in the first arrangement and the two column portions in the second arrangement are positioned at respective vertices of a rectangle, and the two other column portions are arranged on the respective long sides of the rectangle, and
- the column portions of the first and second access transistors are arranged at respective vertices of one of diagonal lines of the rectangle.

22. The semiconductor storage device according to claim 21, wherein the six column portions are arranged at equal intervals along the four sides of the rectangle.

23. The semiconductor storage device according to claim 21, wherein the column portions are arranged over a plurality of the cells at equal intervals along one or both of the first direction and the second direction.

24. The semiconductor storage device according to claim 21, wherein the first and second local interconnects each comprise a buried interconnect having a rectangular planar shape, and are arranged at equal intervals over a plurality of the cells along a second direction in a longitudinal direction of the rectangle.

25. The semiconductor storage device according to claim 7, wherein a first bit line and a second bit line, a ground line and a power line are provided over a plurality of the cells such that the lines stride over the cells;
- the upper-side conductive area of the first access transistor is electrically connected to the first bit line;
- the upper-side conductive area of the second access transistor is electrically connected to the second bit line;

the upper-side conductive areas of the first and second driving transistors are electrically connected to the ground line; and the upper-side conductive areas of the first and second load transistors are electrically connected to the power line.

26. The semiconductor storage device according to claim 7, wherein in each of the first and second arrangements, the three column portions are arranged at equal intervals.

27. The semiconductor storage device according to claim 7, wherein the two column portions in the first arrangement and the two column portions in the second arrangement are positioned at respective vertices of a rectangle, and the two other column portions are arranged on the respective long sides of the rectangle.

28. The semiconductor storage device according to claim 7, wherein the cells are arranged in a matrix in a first direction and a second direction perpendicular to the first direction; and the column portions are arranged over a plurality of the cells at equal intervals along one or both of the first direction and the second direction.

29. A semiconductor storage device comprising a plurality of static random access memory cells, wherein each of the cells comprises a first access transistor, a second access transistor, a first driving transistor, a second driving transistor, a first load transistor and a second load transistor;

each of the transistors comprises a column portion including a semiconductor projecting from a base portion surface, an underside conductive area provided in the base portion and serving as one of a source and a drain, an upper-side conductive area provided in an upper part of the column portion and serving as the other of the source and the drain, a gate electrode provided on a side surface of the column portion, and a gate insulating film interposed between the gate electrode and the column portion side surface;

in each of the cells, the underside conductive areas of the first access transistor, the first driving transistor and the first load transistor are electrically connected together, and further electrically connected to the gate electrodes of the second driving transistor and the second load transistor to form a first accumulation node, the underside conductive areas of the second access transistor, the second driving transistor and the second load transistor are electrically connected together, and further electrically connected to the gate electrodes of the first driving transistor and the first load transistor to form a second accumulation node, and a first arrangement of the column portion of the first access transistor, the column portion of the first driving transistor and the column portion of the first load transistor, and a second arrangement of the column portion of the second access transistor, the column portion of the second driving transistor and the column portion of the second load transistor are symmetric to each other; and in each of the first and second arrangements, the three column portions are arranged in an L shape.

30. A semiconductor storage device comprising a plurality of static random access memory cells, wherein each of the cells comprises a first access transistor, a second access transistor, a first driving transistor, a second driving transistor, a first load transistor and a second load transistor;

each of the transistors comprises a column portion including a semiconductor projecting from a base portion surface, an underside conductive area provided in the base portion and serving as one of a source and a drain, an upper-side conductive area provided in an upper part of the column portion and serving as the other of the source and the drain, a gate electrode provided on a side surface of the column portion, and a gate insulating film interposed between the gate electrode and the column portion side surface;

in each of the cells, the underside conductive areas of the first access transistor, the first driving transistor and the first load transistor are electrically connected together, and further electrically connected to the gate electrodes of the second driving transistor and the second load transistor to form a first accumulation node, the underside conductive areas of the second access transistor, the second driving transistor and the second load transistor are electrically connected together, and further electrically connected to the gate electrodes of the first driving transistor and the first load transistor to form a second accumulation node, and a first arrangement of the column portion of the first access transistor, the column portion of the first driving transistor and the column portion of the first load transistor, and a second arrangement of the column portion of the second access transistor, the column portion of the second driving transistor and the column portion of the second load transistor are symmetric to each other; and in each of the first and second arrangements, the three column portions are arranged at equal intervals.

31. A semiconductor storage device comprising a plurality of static random access memory cells, wherein each of the cells comprises a first access transistor, a second access transistor, a first driving transistor, a second driving transistor, a first load transistor and a second load transistor;

each of the transistors comprises a column portion including a semiconductor projecting from a base portion surface, an underside conductive area provided in the base portion and serving as one of a source and a drain, an upper-side conductive area provided in an upper part of the column portion and serving as the other of the source and the drain, a gate electrode provided on a side surface of the column portion, and a gate insulating film interposed between the gate electrode and the column portion side surface;

in each of the cells, the underside conductive areas of the first access transistor, the first driving transistor and the first load transistor are electrically connected together, and further electrically connected to the gate electrodes of the second driving transistor and the second load transistor to form a first accumulation node, the underside conductive areas of the second access transistor, the second driving transistor and the second load transistor are electrically connected together, and further electrically connected to the gate electrodes of the first driving transistor and the first load transistor to form a second accumulation node, and a first arrangement of the column portion of the first access transistor, the column portion of the first driving transistor and the column portion of the first load transistor, and a second arrangement of the column portion of the second access transistor, the column portion of the second driving transistor and the column portion of the second load transistor are symmetric to each other; and the two column portions in the first arrangement and the two column portions in the second arrangement are positioned at respective vertices of a rectangle, and the two other column portions are arranged on the respective long sides of the rectangle.

32. The semiconductor storage device according to claim 31, wherein the six column portions are arranged at equal intervals along the four sides of the rectangle.

33. A semiconductor storage device comprising a plurality of static random access memory cells, wherein each of the cells comprises a first access transistor, a second access transistor, a first driving transistor, a second driving transistor, a first load transistor and a second load transistor;

each of the transistors comprises a column portion including a semiconductor projecting from a base portion surface, an underside conductive area provided in the base portion and serving as one of a source and a drain, an upper-side conductive area provided in an upper part of the column portion and serving as the other of the source and the drain, a gate electrode provided on a side surface of the column portion, and a gate insulating film interposed between the gate electrode and the column portion side surface;

in each of the cells,
the underside conductive areas of the first access transistor, the first driving transistor and the first load transistor are electrically connected together, and further electrically connected to the gate electrodes of the second driving transistor and the second load transistor to form a first accumulation node, the underside conductive areas of the second access transistor, the second driving transistor and the second load transistor are electrically connected together, and further electrically connected to the gate electrodes of the first driving transistor and the first load transistor to form a second accumulation node, and a first arrangement of the column portion of the first access transistor, the column portion of the first driving transistor and the column portion of the first load transistor, and a second arrangement of the column portion of the second access transistor, the column portion of the second driving transistor and the column portion of the second load transistor are symmetric to each other; and the cells are arranged in a matrix in a first direction and a second direction perpendicular to the first direction; and the column portions are arranged over a plurality of the cells at equal intervals along one or both of the first direction and the second direction.

34. A semiconductor storage device comprising a plurality of static random access memory cells, wherein each of the cells comprises a first access transistor, a second access transistor, a first driving transistor, a second driving transistor, a first load transistor and a second load transistor;

each of the transistors comprises a column portion including a semiconductor projecting from a base portion surface, an underside conductive area provided in the base portion and serving as one of a source and a drain, an upper-side conductive area provided in an upper part of the column portion and serving as the other of the source and the drain, a gate electrode provided on a side surface of the column portion, and a gate insulating film interposed between the gate electrode and the column portion side surface;

in each of the cells,
the underside conductive areas of the first access transistor, the first driving transistor and the first load transistor are electrically connected together, and further electrically connected to the gate electrodes of the second driving transistor and the second load transistor to form a first accumulation node, the underside conductive areas of the second access transistor, the second driving transistor and the second load transistor are electrically connected together, and further electrically connected to the gate electrodes of the first driving transistor and the first load transistor to form a second accumulation node, and a first arrangement of the column portion of the first access transistor, the column portion of the first driving transistor and the column portion of the first load transistor, and a second arrangement of the column portion of the second access transistor, the column portion of the second driving transistor and the column portion of the second load transistor are symmetric to each other; and the cells are arranged in a matrix along a first direction and a second direction perpendicular to the first direction; and the gate electrodes of the first and second access transistors are consecutively and integrally provided along one of the first and second directions over a plurality of the cells.

35. The semiconductor storage device according to claim 34, wherein in each of the cells, in each of the first and second arrangements, the three column portions are arranged in an L shape, the column portions of the first and second driving transistors and the first and second load transistors are positioned at respective vertices of a rectangle, and the column portions of the first and second access transistors are arranged on respective long sides of the rectangle.

36. The semiconductor storage device according to claim 34, wherein in each of the cells, in each of the first and second arrangements, the three column portions are arranged linearly, the two column portions in the first arrangement and the two column portions in the second arrangement are positioned at respective vertices of a rectangle, and the two other column portions are arranged on the respective long sides of the rectangle, and the column portions of the first and second access transistors are arranged at respective vertices of one of short sides of the rectangle.

* * * * *

UNITED STATES PATENT AND TRADEMARK OFFICE
CERTIFICATE OF CORRECTION

| | | |
|---|---|---|
| PATENT NO. | : 8,692,317 B2 | Page 1 of 1 |
| APPLICATION NO. | : 12/922313 | |
| DATED | : April 8, 2014 | |
| INVENTOR(S) | : Kiyoshi Takeuchi | |

It is certified that error appears in the above-identified patent and that said Letters Patent is hereby corrected as shown below:

On the title page under item (73) should read:

Assignee:   RENESAS ELECTRONICS CORPORATION
                  KAWASAKI-SHI, KANAGAWA (JP)

Signed and Sealed this
Twentieth Day of January, 2015

Michelle K. Lee
*Deputy Director of the United States Patent and Trademark Office*